(12) United States Patent
Kanno

(10) Patent No.: US 6,606,046 B2
(45) Date of Patent: Aug. 12, 2003

(54) METHOD AND APPARATUS FOR DIGITAL-TO-ANALOG CONVERSION WITH AN EFFECTIVE PULSE WIDTH MODULATION

(75) Inventor: Tohru Kanno, Kanagawa-ken (JP)

(73) Assignee: Ricoh Company, Ltd., Tokyo (JP)

(*) Notice: Subject to any disclaimer, the term of this patent is extended or adjusted under 35 U.S.C. 154(b) by 0 days.

(21) Appl. No.: 10/101,914

(22) Filed: Mar. 21, 2002

(65) Prior Publication Data

US 2002/0149505 A1 Oct. 17, 2002

(30) Foreign Application Priority Data

Mar. 21, 2001 (JP) .......................... 2001-081217
Jan. 31, 2002 (JP) .......................... 2002-023245

(51) Int. Cl.$^7$ .............................................. H03M 1/66
(52) U.S. Cl. ..................... 341/144; 341/145; 341/152; 375/238
(58) Field of Search ................ 341/144, 145, 341/152; 375/238

(56) References Cited

U.S. PATENT DOCUMENTS 4,095,218 A * 6/1978 Crouse ....................... 341/145
6,181,266 B1 * 1/2001 Toki ........................... 341/152

FOREIGN PATENT DOCUMENTS

JP  3-53042   5/1991  ............ H03M/1/82
JP  6-13231   2/1994  ............ H03M/1/82

* cited by examiner

Primary Examiner—Peguy JeanPierre
(74) Attorney, Agent, or Firm—Oblon, Spivak, McClelland, Maier & Neustadt, P.C.

(57) ABSTRACT

A digital-to-analog converter including a signal generator, a low-weighted value manager, and a voltage smoothing circuit. The signal generator performs a pulse width modulation (pwm) based on a reference clock signal and upper nh bits of the n-bit digital data to generate a first pulse-width-modulated signal having first pulses having a first pulse width in response to a value of the upper nh bits of the n-bit digital data and a pwm cycle signal. The low-weighted value manager divides a pulse width in response to a value of the lower nl bits of the n-bit digital data into fraction pulse widths, respectively adds the fraction pulse widths to the first pulses, and generates a second pulse-width-modulated signal having second pulses including the first pulse width and one of the fraction pulse widths.

48 Claims, 22 Drawing Sheets

FIG. 11

TABLE 1

| D7 | D6 | D5 | D4 | Vpwm (A>B=L) | Vpwm (A>B=H) |
|---|---|---|---|---|---|
| L | L | L | L | Vl | 1/16*(Vh−Vl)+Vl |
| L | L | L | H | 1/16*(Vh−Vl)+Vl | 2/16*(Vh−Vl)+Vl |
| L | L | H | L | 2/16*(Vh−Vl)+Vl | 3/16*(Vh−Vl)+Vl |
| L | L | H | H | 3/16*(Vh−Vl)+Vl | 4/16*(Vh−Vl)+Vl |
| L | H | L | L | 4/16*(Vh−Vl)+Vl | 5/16*(Vh−Vl)+Vl |
| L | H | L | H | 5/16*(Vh−Vl)+Vl | 6/16*(Vh−Vl)+Vl |
| L | H | H | L | 6/16*(Vh−Vl)+Vl | 7/16*(Vh−Vl)+Vl |
| L | H | H | H | 7/16*(Vh−Vl)+Vl | 8/16*(Vh−Vl)+Vl |
| H | L | L | L | 8/16*(Vh−Vl)+Vl | 9/16*(Vh−Vl)+Vl |
| H | L | L | H | 9/16*(Vh−Vl)+Vl | 10/16*(Vh−Vl)+Vl |
| H | L | H | L | 10/16*(Vh−Vl)+Vl | 11/16*(Vh−Vl)+Vl |
| H | L | H | H | 11/16*(Vh−Vl)+Vl | 12/16*(Vh−Vl)+Vl |
| H | H | L | L | 12/16*(Vh−Vl)+Vl | 13/16*(Vh−Vl)+Vl |
| H | H | L | H | 13/16*(Vh−Vl)+Vl | 14/16*(Vh−Vl)+Vl |
| H | H | H | L | 14/16*(Vh−Vl)+Vl | 15/16*(Vh−Vl)+Vl |
| H | H | H | H | 15/16*(Vh−Vl)+Vl | Vh |

FIG. 15

TABLE 2

| MPX3 | MPX2 | MPX1 | MPX0 | Vpwm (A>B=L) | Vpwm (A>B=H) |
|---|---|---|---|---|---|
| L | L | L | L | Vl | − |
| L | L | L | H | 1/16*(Vh−Vl)+Vl | − |
| L | L | H | L | 2/16*(Vh−Vl)+Vl | − |
| L | L | H | H | 3/16*(Vh−Vl)+Vl | − |
| L | H | L | L | 4/16*(Vh−Vl)+Vl | − |
| L | H | L | H | 5/16*(Vh−Vl)+Vl | − |
| L | H | H | L | 6/16*(Vh−Vl)+Vl | − |
| L | H | H | H | 7/16*(Vh−Vl)+Vl | − |
| H | L | L | L | 8/16*(Vh−Vl)+Vl | − |
| H | L | L | H | 9/16*(Vh−Vl)+Vl | − |
| H | L | H | L | 10/16*(Vh−Vl)+Vl | − |
| H | L | H | H | 11/16*(Vh−Vl)+Vl | − |
| H | H | L | L | 12/16*(Vh−Vl)+Vl | − |
| H | H | L | H | 13/16*(Vh−Vl)+Vl | − |
| H | H | H | L | 14/16*(Vh−Vl)+Vl | − |
| H | H | H | H | 15/16*(Vh−Vl)+Vl | Vh |

METHOD AND APPARATUS FOR DIGITAL-TO-ANALOG CONVERSION WITH AN EFFECTIVE PULSE WIDTH MODULATION

CROSS REFERENCE TO RELATED APPLICATIONS

This patent specification claims priority and is related to Japanese patent applications, No. JPAP2001-081217 filed on Mar. 21, 2001 and No. 2002-23245 filed on Jan. 31, 2002, the entire contents of which are incorporated herein by reference.

BACKGROUND OF THE INVENTION

1. Field of the Invention

The present invention relates to a method and apparatus for digital-to-analog conversion, and more particularly to a method and apparatus for digital-to-analog conversion with an effective pulse width modulation.

2. Discussion of Background

FIG. 1 shows a typical structure of a background digital-to-analog converter that converts digital data into analog data with a pulse width modulation (PWM) technique which is described, for example, in Japanese unexamined utility publications, No. 3-53042 (1991) and No. 6-13231 (1992).

As shown in FIG. 1, the background digital-to-analog converter (often referred to as a DA converter or a DAC) includes a ring counter (COUNT) 1, a magnitude comparator (COMP) 2, and an RC circuit 3. The ring counter 1 counts inputs of a main clock signal MCLK and outputs clock count information composed of, for example, eight bits whose bit number corresponds to the resolution of the DAC. The resolution of the DAC is 1/256 in this case. A cycle of the main clock MCLK is referred to as Tmclk, and an eight-bit counting cycle of the ring counter 1 is referred to as a pulse width modulation cycle Tpwm. The pulse width modulation cycle Tpwm includes 256 Tmclk cycles of the main clock. The magnitude comparator 2 receives the eight-bit clock count information on input terminals B0–B7, and a data set DSET composed of eight bits, whose number of bits is equal to that of the clock count information, on input terminals A0–A7. The eight-bit data set DSET has a value corresponding to a desired output level and is sent from a central processing unit or (CPU) or the like (not shown).

The background DA converter is a converter used, for example, as a feedback circuit for adjusting a direct current level of an analog signal or as a full-scale or for adjusting a zero-scale level of an analog-to-digital (AD) converter in a control for automatically adjusting a reading level of a reading mechanism in a digital copying machine, a scanner, or the like. The data set DSET applied to the background DA converter is changed in a cycle sufficiently longer than the pulse width modulation cycle Tpwm.

The ring counter 1 counts the main clock MCLK at all times and outputs a count value on the eight-bit output terminals Q0–Q7 to the input terminals B0–B7 of the magnitude comparator 2. The comparator 2 compares the count value with the value of the data set DSET. During the time the count value is smaller than the data set DSET, the comparator 2 outputs a pulse signal Vpwm in a high state which has a pulse width corresponding to the value of the data set DSET, as shown in FIG. 2. The pulse signal Vpwm is smoothed through the RC circuit 3 including a resistor R and a capacitor C, and a resultant analog voltage Vdac in response to the value of the data set DSET is output.

In FIG. 2, Th represent a time length of the pulse signal Vpwm in a high state which is composed of Tmclk multiplied by the value of the data set DSET. Tl represent a time length of the pulse signal Vpwm in a low state which includes Tmclk multiplied by a value of 256 Tmclk subtracted by the data set DSET.

FIG. 3 is a time chart showing a relationship between the pulse signal Vpwm and the analog voltage Vdac in two exemplary cases at the same time. In one case in which waveforms are indicated by solid lines, the value of the data set DSET is set to 128, for example, and the related signal and waveform are labeled with a suffix numeral 128. In the other case in which waveforms are indicated by dotted lines, the value of the data set DSET is set to 64, for example, and the related signal and waveform are labeled with a suffix numeral 64. For example, Vpwm128 indicates as the pulse signal Vpwm in the case where the data set DSET is set to 128, and Vpwm64 indicates as the pulse signal Vpwm in the case where the data set DSET is set to 64. In addition, a mean voltage of the analog voltage Vdac128 is referred to as Vdacm128, and a mean value of the analog voltage Vdac64 is referred to as Vdacm64.

A relationship between the analog voltage Vdac and the value of the data set DSET is expressed by the following equation;

$$Vdac=(DSET/256) \times (Vh-Vl)+Vl,$$

where Vh represents the pulse signal Vpwm in a high state and Vl represents the pulse signal Vpwm in a low state.

To maintain the above relationship, an amount of change in the analog voltage Vdac during the time the pulse signal Vpwm in a high state or a low state should necessarily be smaller than a half the resolution of the DAC. For this maintenance, an amount of change in the analog voltage Vdac should satisfy the following relationships (1) and (2):

when the pulse signal Vpwm is in a high state $$\{Vh-Vdac(0)\} \times \{1-\exp(-Th/\tau)\} < ((Vh-Vl)/256)/2, \qquad (1)$$

and when the pulse signal Vpwm is in a low state $$\{Vl-Vdac(1)\} \times \{1-\exp(-Th/\tau)\} > (Vh-Vl)/256)/2, \qquad (2)$$

where Vdac(0) represents a value of the analog voltage Vdac immediately before the pulse signal Vpwm is raised to a high level, Vdac(1) represents a value of the analog voltage Vdac immediately before the pulse signal Vpwm is lowered to a low level, and τ represents a time constant of the RC circuit. In FIG. 3, an amount of change in the analog voltage Vdac discussed above is referred to as a ripple voltage Vrip-A in the case of 128 DSET and a ripple voltage Vrip-B in the case of 64 DSET.

In the relationships above, when the time constant τ is far greater than the time length T which is the sum of the time lengths Th and Tl, a condition of Th=Tl will give a maximum amount of change in the analog voltage Vdac in the relationship (1) as well as a minimum amount in the relationship (2). In addition, the relationships (1) and (2) are equivalent when the voltage Vl is 0. Therefore, based on the relationship (1), the following relationship can be obtained in consideration of a steady state:

$$Vh(1-0.5) \times \{1-\exp(-T/2/\tau)\} < (Vh/256)/2.$$

This relationship may be modified to;

$$\text{Exp}(-T/2/\tau) > 1-1/256=255/256,$$

and further to;

$$-T/2/\tau > \ln(255/256).$$

Finally, the following approximation can be made;

$$T < -2 \times \tau \times \ln(255/256) \approx 2 \times \tau \times (1/256) = \tau/128.$$

When the main clock signal MCLK has a frequency of 10 MHz, the time constant of the RC filter 3 can be calculated as follows;

$$\tau > T \times 128 = 0.1 \ \mu s \times 256 \times 128 = 3.3 \ ms.$$

Consequently, when the analog voltage Vdac is changed from 0 to a full scale, for example, it takes an extremely long response time t as;

$$t = -\tau \times \ln(1/512) = 20.6 \ ms.$$

SUMMARY OF THE INVENTION

One object of the present invention is to provide a novel digital-to-analog converter for converting an n-bit digital data set to an analog voltage, where n is an arbitrary integer and the n bits include upper nh bits and lower nl bits. Accordingly, in one embodiment of the present invention, a novel digital-to-analog converter includes a signal generator, a low-weighted value manager, and a voltage smoothing circuit. The signal generator is arranged and configured to perform a pulse width modulation based on inputs of a reference clock signal and the upper nh bits of the n-bit digital data set and configured to generate a first pulse-width-modulated signal having a plurality of first pulses having a first pulse width in response to a value of the upper nh bits of the n-bit digital data set and a pwm cycle signal indicating a cycle of a pulse width modulation performed. The low-weighted value manager is arranged and configured to receive the pulse-width-modulated signal, the pwm cycle signal, and the lower nl bits of the n-bit digital data set, configured to divide a pulse width in response to a value of the lower nl bits of the n-bit digital data set into a plurality of fraction pulse widths, to respectively add the plurality of fraction pulse widths to the plurality of first pulses, and to generate a second pulse-width-modulated signal having a plurality of second pulses having the first pulse width and one of the plurality of fraction pulse widths. The voltage smoothing circuit is arranged and configured to smooth the second pulse-width-modulated signal.

Further, another object of the present invention is to provide a novel digital-to-analog converter for converting an n-bit digital data set to an analog voltage, where n is an arbitrary integer and the n bits include upper nh bits and lower nl bits. Accordingly, in one embodiment of the present invention, a novel digital-to-analog converter includes a signal generator, an amplitude regulator, a bottom-level regulator, a voltage adding circuit, and a voltage smoothing circuit. The signal generator is arranged and configured to perform a pulse width modulation based on inputs of a reference clock signal and the lower nl bits of the n-bit digital data set and configured to generate a pulse-width-modulated signal having a plurality of first pulses having a first pulse width in response to a value of the lower nh bits of the n-bit digital data set. The amplitude regulator is arranged and configured to regulate an amplitude of the pulse-width-modulated signal generated by the signal generator. The bottom-level regulator is arranged and configured to receive the upper nh bits of the n-bit digital data set and to regulate a bottom level of a voltage in accordance with a value of the upper nh bits of the n-bits digital data set. The voltage adding circuit is arranged and configured to add the pulse-width-modulated signal having an amplitude regulated by the amplitude regulator to the voltage having a bottom level regulated by the bottom-level regulator and configured to output a composite voltage. The voltage smoothing circuit is arranged and configured to smooth the composite voltage output by the voltage adding circuit.

Further, another object of the present invention is to provide a novel digital-to-analog converter for converting an n-bit digital data set to an analog voltage, where n is an arbitrary integer and the n bits include upper nh bits and lower nl bits. Accordingly, in one embodiment of the present invention, the novel digital-to-analog converter includes a signal generator, a low-weighted value manager, a level regulator, and a voltage smoothing circuit. The signal generator is arranged and configured to perform a pulse width modulation based on inputs of a reference clock signal and the upper nh bits of the n-bit digital data set and configured to generate a first pulse-width-modulated signal having a plurality of first pulses having a first pulse width in response to a value of the upper nh bits of the n-bit digital data set and a pwm cycle signal indicating a cycle of a pulse width modulation performed. The low-weighted value manager is arranged and configured to receive the pulse-width-modulated signal, the pwm cycle signal, and the lower nl bits of the n-bit digital data set configured to generate multi-bit pulse-width-modulated signals including the pulse-width-modulated signal as a least significant bit and the lower nl bits of the n-bit digital data set. The level regulator is arranged and configured to receive the multi-bit pulse-width-modulated signals and to output an analog voltage with an upper level regulated in response to a value of the multi-bit pulse-width-modulated signals. The voltage smoothing circuit is arranged and configured to smooth the analog voltage output by the level regulator.

Further, another object of the present invention is to provide a novel method of digital-to-analog conversion for converting an n-bit digital data set to an analog voltage, where n is an arbitrary integer and the n bits include upper nh bits and lower nl bits. Accordingly, in one embodiment of the present invention, a novel method of digital-to-analog conversion includes the steps of performing, dividing, adding, and smoothing. The performing step performs a pulse width modulation based on inputs of a reference clock signal and the upper nh bits of the n-bit digital data set and generates a first pulse-width-modulated signal having a plurality of first pulses having a first pulse width in response to a value of the upper nh bits of the n-bit digital data set and a pwm cycle signal indicating a cycle of a pulse width modulation performed. The dividing step divides a pulse width in response to a value of the lower nl bits of the n-bit digital data set into a plurality of fraction pulse widths. The adding step adds respectively the plurality of fraction pulse widths to the plurality of first pulses to output a second pulse-width-modulated signal having a plurality of second pulses having the first pulse width and one of the plurality of fraction pulse widths. The smoothing step smoothes the second pulse-width-modulated signal output in the adding step.

Further, one object of the present invention is to provide a novel method of digital-to-analog conversion converts n-bit digital data set to an analog voltage, where n is an arbitrary integer and the n bits include upper nh bits and lower nl bits. Accordingly, in one embodiment of the present invention, the novel method of digital-to-analog conversion includes the steps of performing, regulating, determining, adding, and smoothing. The performing step performs a pulse width modulation based on inputs of a reference clock signal and the lower nl bits of the n-bit digital data set and generates a pulse-width-modulated signal having a plurality of first pulses having a first pulse width in response to a value of the lower nh bits of the n-bit digital data set. The regulating step regulates an amplitude of the pulse-width-modulated signal generated in the performing step. The determining step determines a bottom level of a voltage in accordance with a value of the upper nh bits of the n-bits digital data set. The adding step adds the pulse-width-modulated signal having an amplitude regulated in the regulating step to the voltage having a bottom level determined in the determining step to output a composite voltage. The smoothing step smoothes the composite voltage output in the adding step.

Further, one object of the present invention is to provide a novel method of digital-to-analog conversion converts n-bit digital data set to an analog voltage, where n is an arbitrary integer and the n bits include upper nh bits and lower nl bits. Accordingly in one embodiment of the present invention, the novel method for digital-to-analog conversion includes the steps of performing, generating, outputting, and smoothing. The performing step performs a pulse width modulation based on inputs of a reference clock signal and the upper nh bits of the n-bit digital data set to generate a first pulse-width-modulated signal having a plurality of first pulses having a first pulse width in response to a value of the upper nh bits of the n-bit digital data set and a pwm cycle signal indicating a cycle of a pulse width modulation performed. The generating step generates multi-bit pulse-width-modulated signals including the pulse-width-modulated signal as a least significant bit and the lower nl bits of the n-bit digital data set. The outputting step outputs an analog voltage with an upper level regulated in response to a value of the multi-bit pulse-width-modulated signals. The smoothing step smoothes the analog voltage output in the outputting means.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIG. 11 is a table showing relationships among upper bits of the input data set, a pulse width modulation signal, and a condition signal referred to as an output A>B;

FIG. 15 is a table showing relationships among values of multiplexers, a pulse width modulation signal, and a condition signal referred to as an output A>B;

DETAILED DESCRIPTION OF PREFERRED EMBODIMENTS

Figure 1:
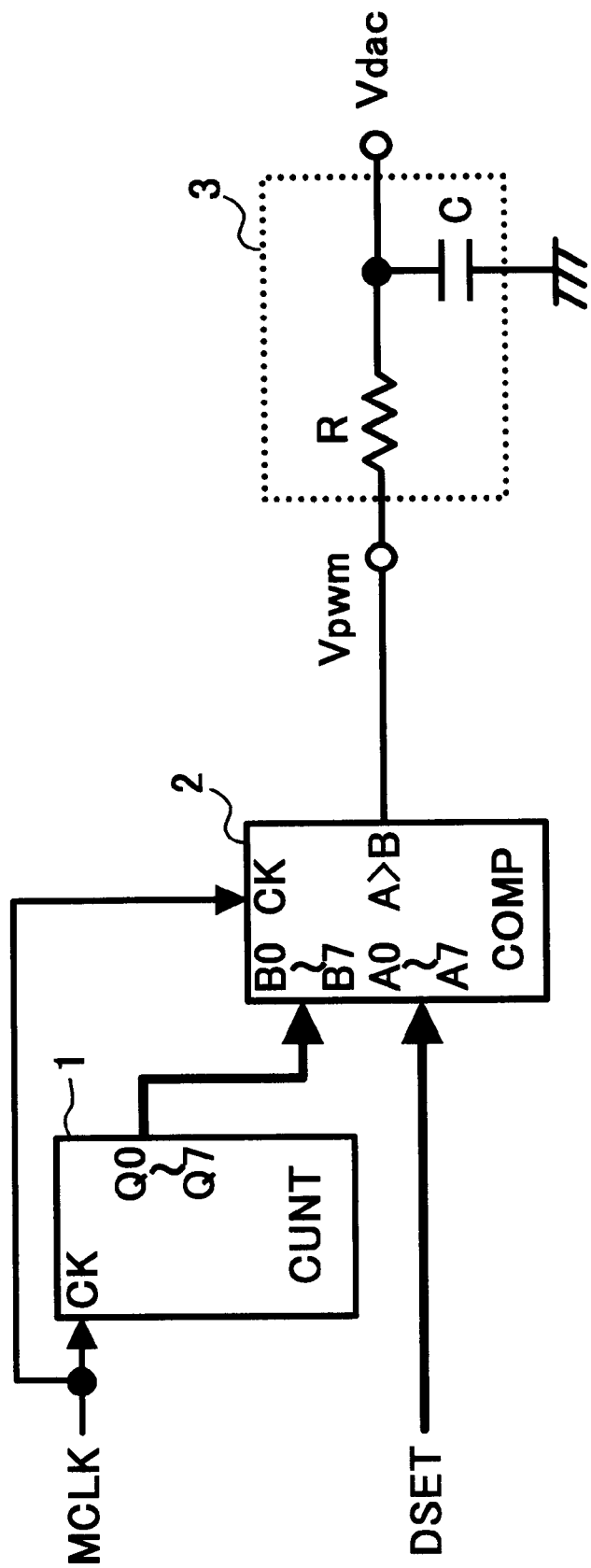
FIG. 1 is a schematic diagram of a background digital-to-analog converter.
Figure 2:
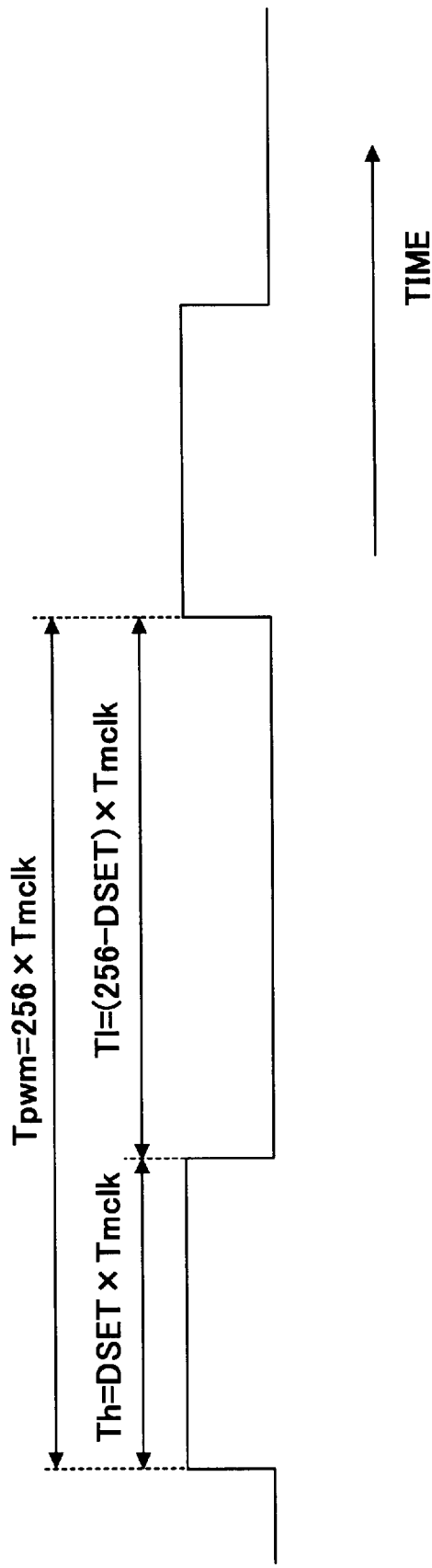
FIG. 2 is a time chart for explaining a pulse width modulation performed by the background digital-to-analog converter of FIG. 1.
Figure 3:
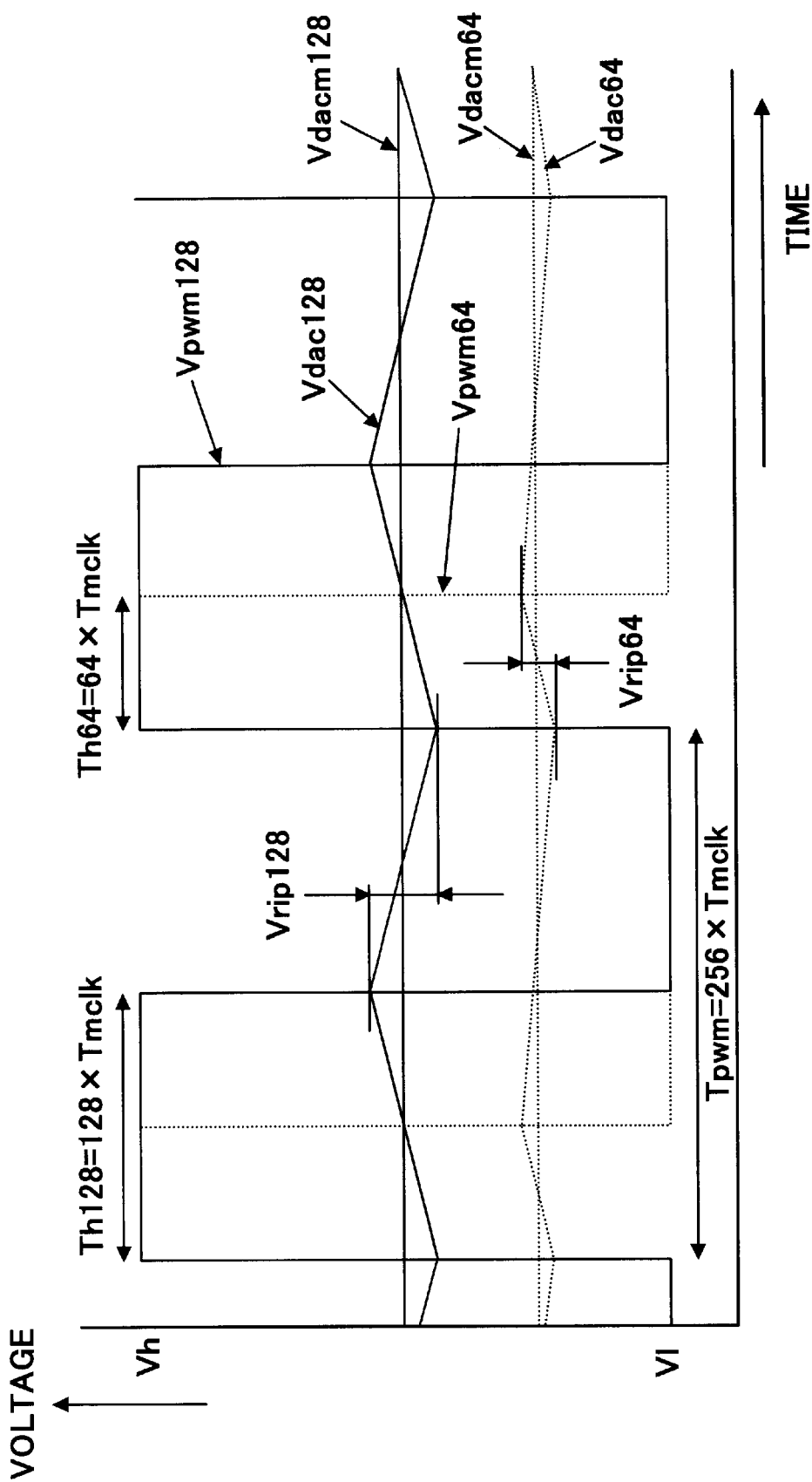
FIG. 3 is a time chart for explaining the pulse width modulation performed by the background digital-to-analog converter of FIG. 1 when an input data set is 128 and 64.
Figure 4:
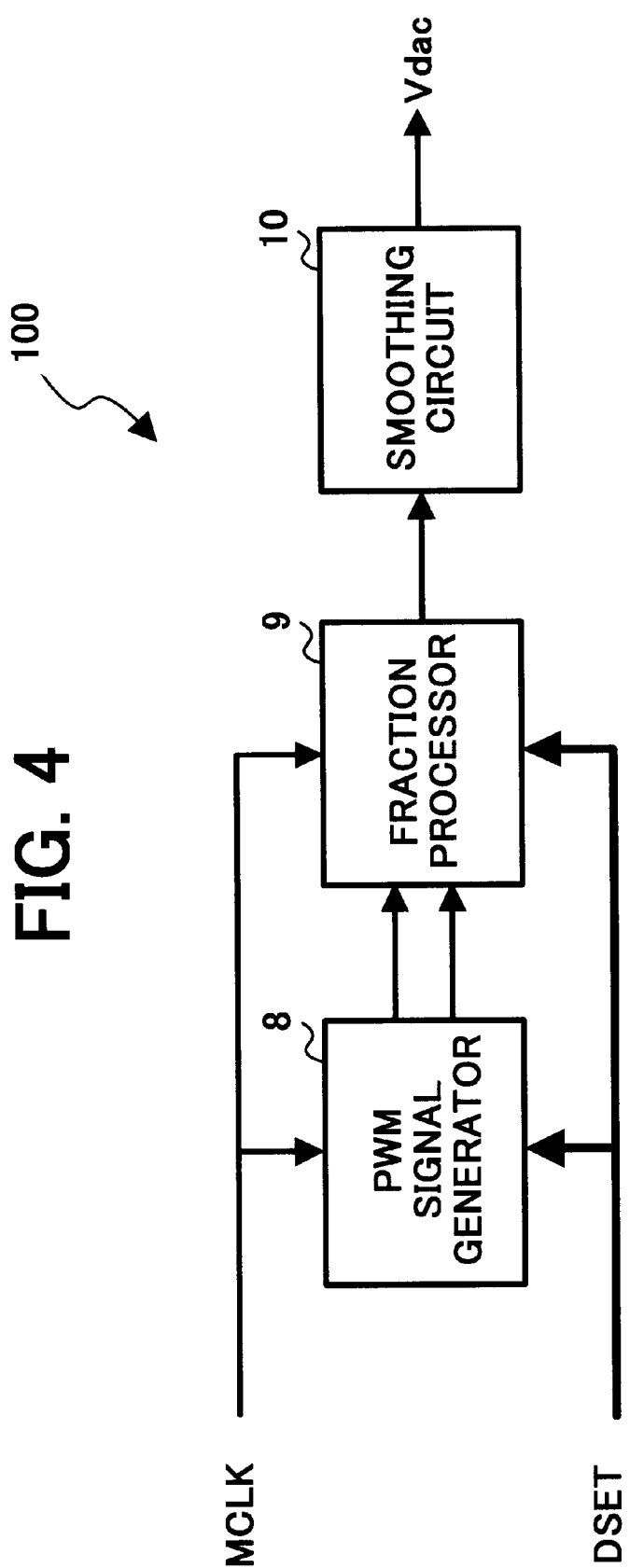
FIG. 4 is a schematic block diagram of a digital-to-analog converter according to a preferred embodiment of the present invention.

In describing the preferred embodiments illustrated in the drawings, specific terminology is employed for the sake of clarity. However, the disclosure is not intended to be limited to the specific terminology so selected, and it is to be understood that each specific element includes all technical equivalents that operate in a similar manner. Referring now to the drawings, wherein like reference numerals designate identical or corresponding parts throughout the several views, and more particularly to FIG. 4, a description is made for an digital-to-analog (DA) converter 100 according to one preferred embodiment of the present invention. FIG. 4 shows a block diagram of the DA converter 100 that includes a PWM (pulse width modulation) signal generator 8, a fraction processor 9, and a smoothing circuit 10.

The PWM signal generator 8 receives a main clock signal MCLK sent from a clock signal generator (not shown) and upper bits of the input data set DSET sent from a CPU (central processing unit) or the like (not shown). The PWM signal generator 8 performs a pulse width modulation for modulating the input data set DSET with a counter for counting the main clock signal MCLK, and outputs a resultant analog voltage and a PWM cycle signal to the fraction processor 9. In addition to these signals, the fraction processor 9 also receives the main clock signal MCLK and lower bits of the input data set DSET. The fraction processor 9 performs a PWM cycle division and, when a fraction is produced by the PWM cycle division, splits and distributes the fraction to each of the divided cycles. The fraction processor 9 outputs a resultant analog voltage. The smoothing circuit 10 smoothes the resultant analog voltage and outputs a desired analog voltage Vdac in response to a value of the input data set DSET.

Figure 5:
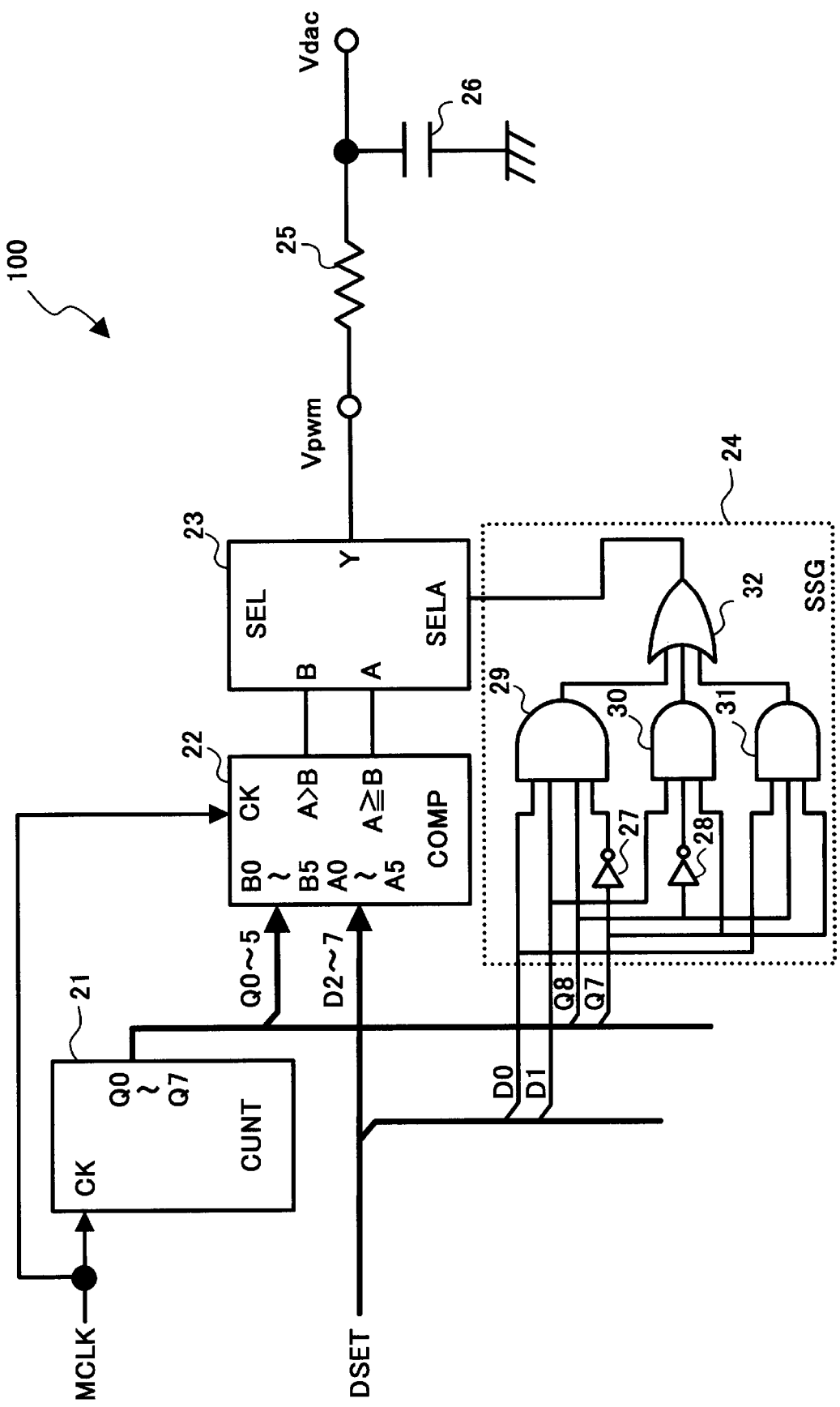
FIG. 5 is a schematic circuit diagram of the digital-to-analog converter of FIG. 4.

FIG. 5 shows further details of the structure of the DA converter 100. As shown in FIG. 5, the DA converter 100 is provided with an eight bit counter (CUNT) 21, a magnitude comparator (COMP) 22, a data selector (SEL) 23, a selection signal generator (SSG) 24, a resistor 25, and a capacitor 26. The selection signal generator 24 includes inverters 27 and 28, NAND gates 29–31, and an OR gate 32. Lower six bits Q0–Q5 of the counter 21 and an output A>B of the comparator 22 configure the PWM signal generator 8 of FIG. 4. Upper two bits Q6 and Q7 of the counter 21, an output A≧B of the comparator 22, the data selector 23, the inverters 27 and 28, the NAND gates 29–31, and the OR gate 32 configure the fraction processor 9 of FIG. 4. The resistor 25 and the capacitor 31 configure the smoothing circuit 10 of FIG. 4.

A cycle of the main clock MCLK is referred to as Tmclk, and an eight-bit counting cycle of the counter 21 is referred to as a pulse width modulation cycle Tpwm. In this example, the data set DSET is composed of eight data bits D0–D7 and a cycle of the data set DSET is sufficiently longer than the pulse width modulation cycle Tpwm.

The counter 21 counts the main clock signal MCLK and outputs each counting result from the outputs Q0–Q7. The magnitude comparator 22 has input terminals B0–B5 for receiving the outputs Q0–Q5, respectively, and input terminals A0–A5 for receiving upper six bits D2–D7, respectively, of the data set DSET. The outputs Q6 and Q7 from the counter 21 and the lower two bits D0 and D1 of the data set DSET are connected to the selection signal generator 24.

The magnitude comparator 22 outputs a high signal from the A>B output terminal when a value of the input terminals A0–A5 is greater than that of the input terminals B0–B5. Also, the magnitude comparator 22 outputs a high signal from the A≧B output terminal when a value of the input terminals A0–A5 is equal to or greater than that of the input terminals B0–B5. The high signal from the A>B output terminal is input to an input terminal B of the data selection 23, and the high signal from the A≧B output terminal is input to an input terminal A of the data selection 23. The data selector 23 enables the input terminal A when a selection terminal SELA is high and enables the input terminal B when SELA is low. The data selector 23 outputs a pulse signal Vpwm. The pulse signal Vpwm is smoothed by the smoothing circuit 10 including the resistor 25 and the capacitor 26. The smoothing circuit 10 outputs a resultant analog voltage Vdac in response to the value of the data set DSET.

Figure 6:
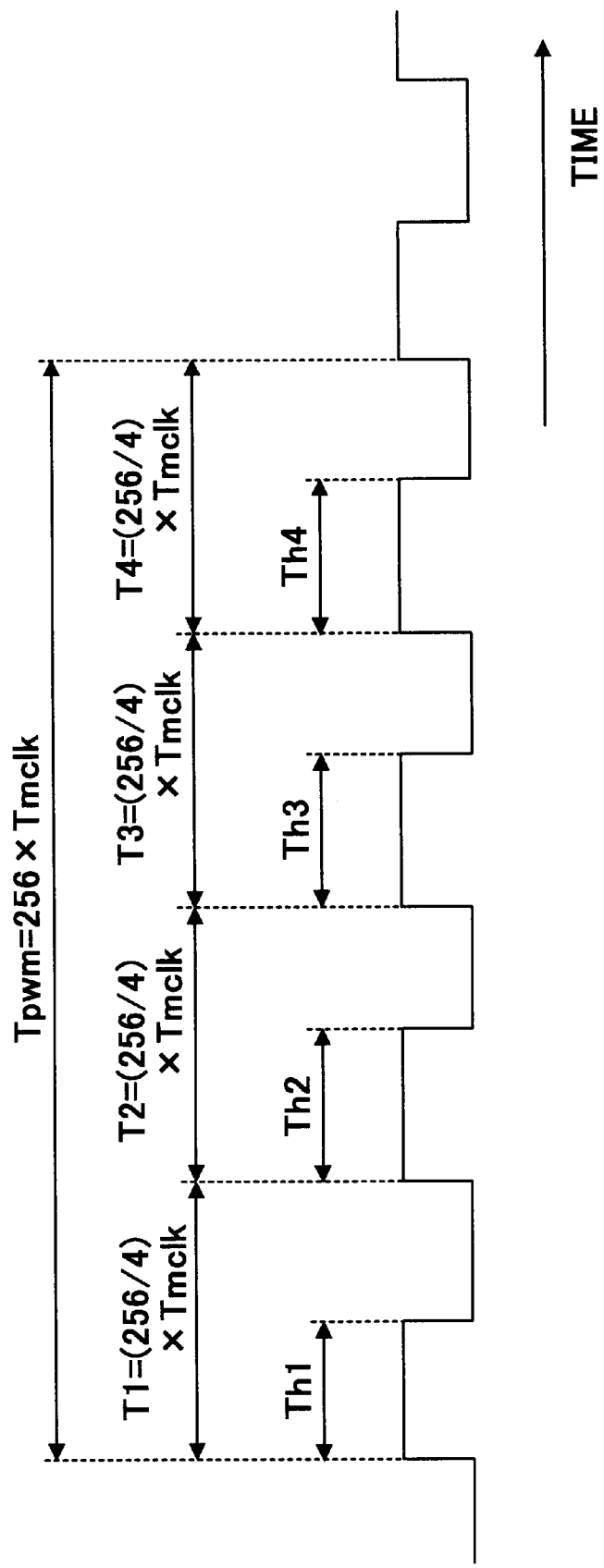
FIG. 6 is a time chart for explaining a pulse width modulation performed by the digital-to-analog converter of FIG. 4.

FIG. 6 shows an example of the pulse signal Vpwm output from the smoothing circuit 10. This example is based on the resolution of eight bits (i.e., 1/256) and a four-way division of the pulse width modulation cycle Tpwm that includes 256 Tmclk. As shown in FIG. 6, each of pulse widths T1–T4 of the pulse width modulation cycle Tpwm includes 64 Tmclk.

The pulse widths T1–T4 in a high level are defined in the following manners, in which "int( )" indicates an operation in which a value enclosed by brackets is made an integer through a decimal round down, that is, a value smaller than a decimal point is rounded down, and DSET' is defined by DSET'=int(DSET/4)×4. A difference between the maximum and the minimum of Th1–Th4 is smaller than one Tmclk:
T1; Th1=int(DSET/4),
T2; Th2=Th1+int(DSET'/3)×Tmclk,
T3; Th3=Th1+int(DSET'/2)×Tmclk, and
T4; Th4=Th1+DSET'−int(DSET'/2)×2×Tmclk.

Figure 7:
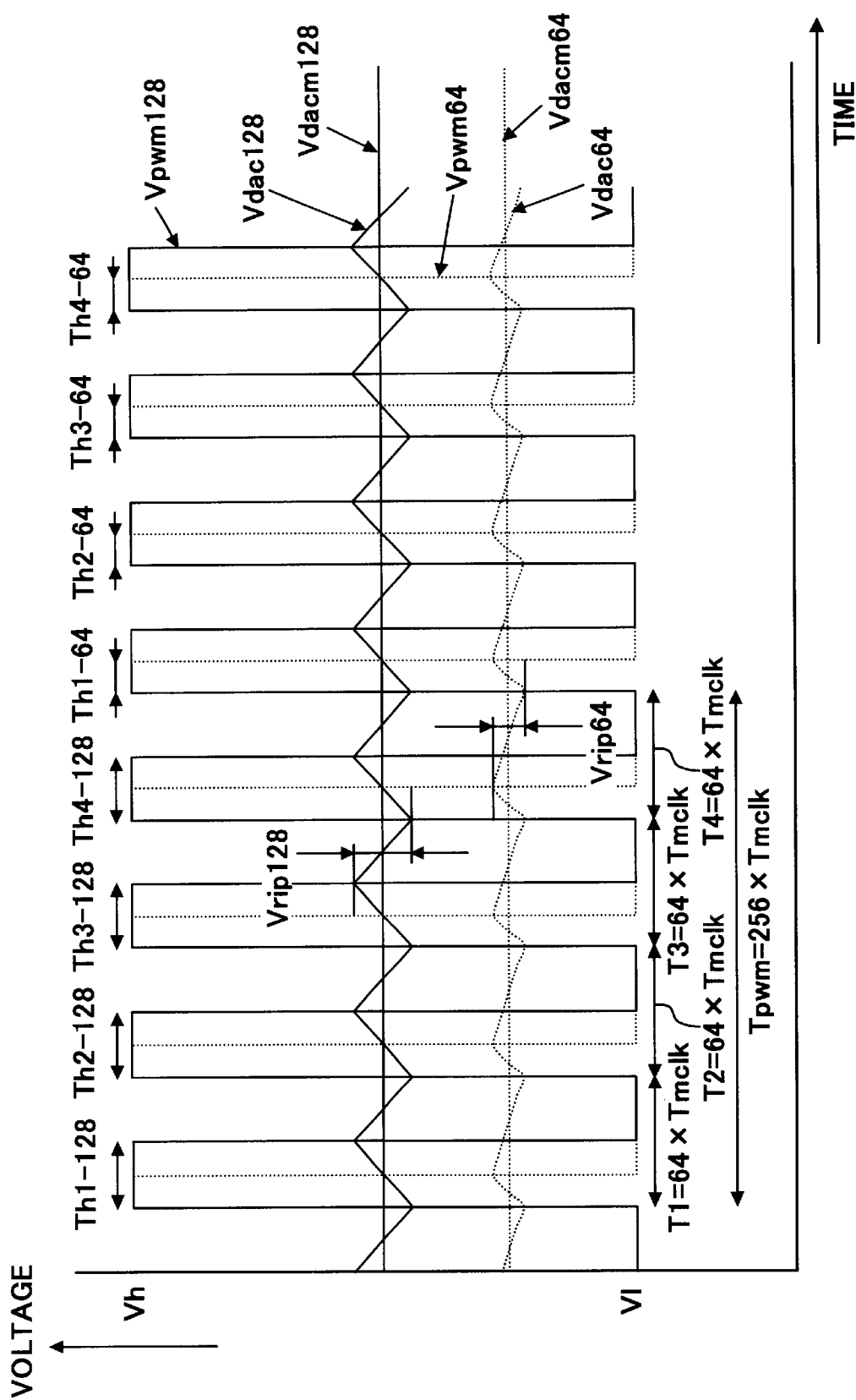
FIG. 7 is a time chart for explaining the pulse width modulation performed by the digital-to-analog converter of FIG. 4 when an input data set is 128 and 64.

FIG. 7 is a time chart showing a relationship between the pulse signal Vpwm and the analog voltage Vdac in two exemplary cases at the same time. In one case in which waveforms are indicated in solid lines, the value of the data set DSET is set to 128, for example, and the related signal and waveform are labeled with a suffix numeral 128. In the other case in which waveforms are indicated in dotted lines, the value of the data set DSET is set to 64, for example, and the related signal and waveform are labeled with a suffix numeral 64. For example, Vpwm128 indicates as the pulse signal Vpwm in the case where the data set DSET is set to 128, and Vpwm64 indicates as the pulse signal Vpwm in the case where the data set DSET is set to 64.

Thus, in the above-described structure of the DA converter 100, the pulse width modulation cycle Tpwm is divided into one fourth in the pulse width modulation, that is, a ripple frequency is increased to four times the ripple frequency of the background DA converter. In addition, allowable variations of the analog voltage Vdac in high and low are supposed to remain the same as those in the background DA converter. Accordingly, in the DA converter 100, the time constant of the RC circuit can be reduced to one fourth, and consequently the response time can be reduced to one fourth. The pulse width modulation cycle Tpwm can be divided into an arbitrary number of time periods. However, it should be noted that the above-described structure is achieved when a division number is smaller than a value of 2 raised to the n minus one power, in which n represents a number of bits of the DAC.

Figure 8:
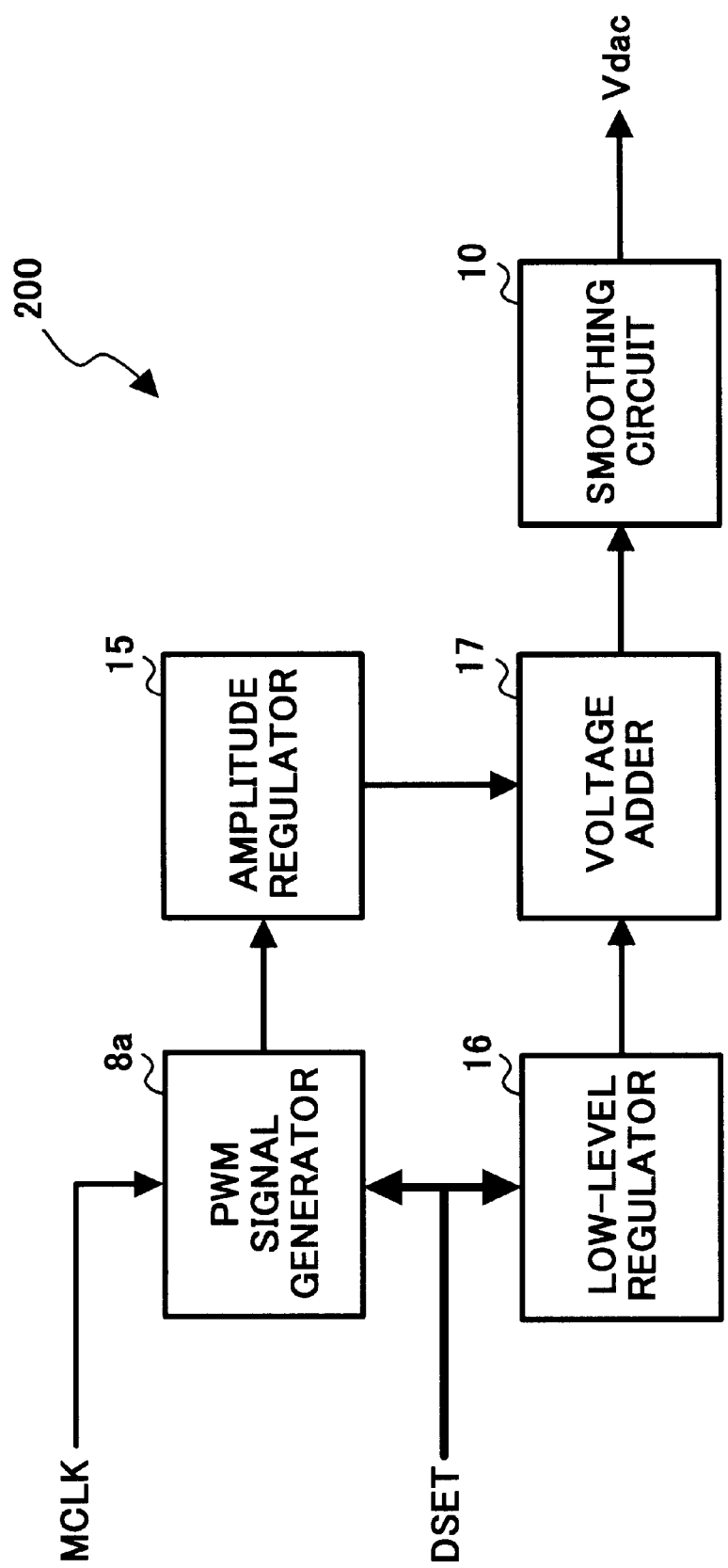
FIG. 8 is a schematic block diagram of a digital-to-analog converter according to another preferred embodiment of the present invention.

Next, a digital-to-analog (DA) converter 200 according to another preferred embodiment of the present invention is explained with reference to FIG. 8. As shown in FIG. 8, the DA converter 200 includes a PWM (pulse width modulation) signal generator 8a, an amplitude regulator 15, a low-level regulator 16, a voltage adder 17, and the smoothing circuit 10. The smoothing circuit 10 is the one described in the discussion of the DA converter 100.

The PWM signal generator 8a receives a main clock signal MCLK and lower bits of the input data set DSET. The PWM signal generator 8a performs a pulse width modulation relative to the input data set DSET with a counter for counting the main clock signal MCLK, and outputs a PWM signal to the amplitude regulator 15. The amplitude regulator 15 regulates an amplitude of the PWM signal and outputs a voltage to the voltage adder 17. The low-level regulator 16 regulates and outputs a relatively low level voltage to the voltage adder 17. The voltage adder 17 adds the voltage from the amplitude regulator 15 and the low-level voltage from the low-level regulator 16, and outputs a composite analog voltage to the smoothing circuit 10. The smoothing circuit smoothes the composite analog voltage and outputs a desired analog voltage Vdac in response to a value of the input data set DSET.

Figure 9:
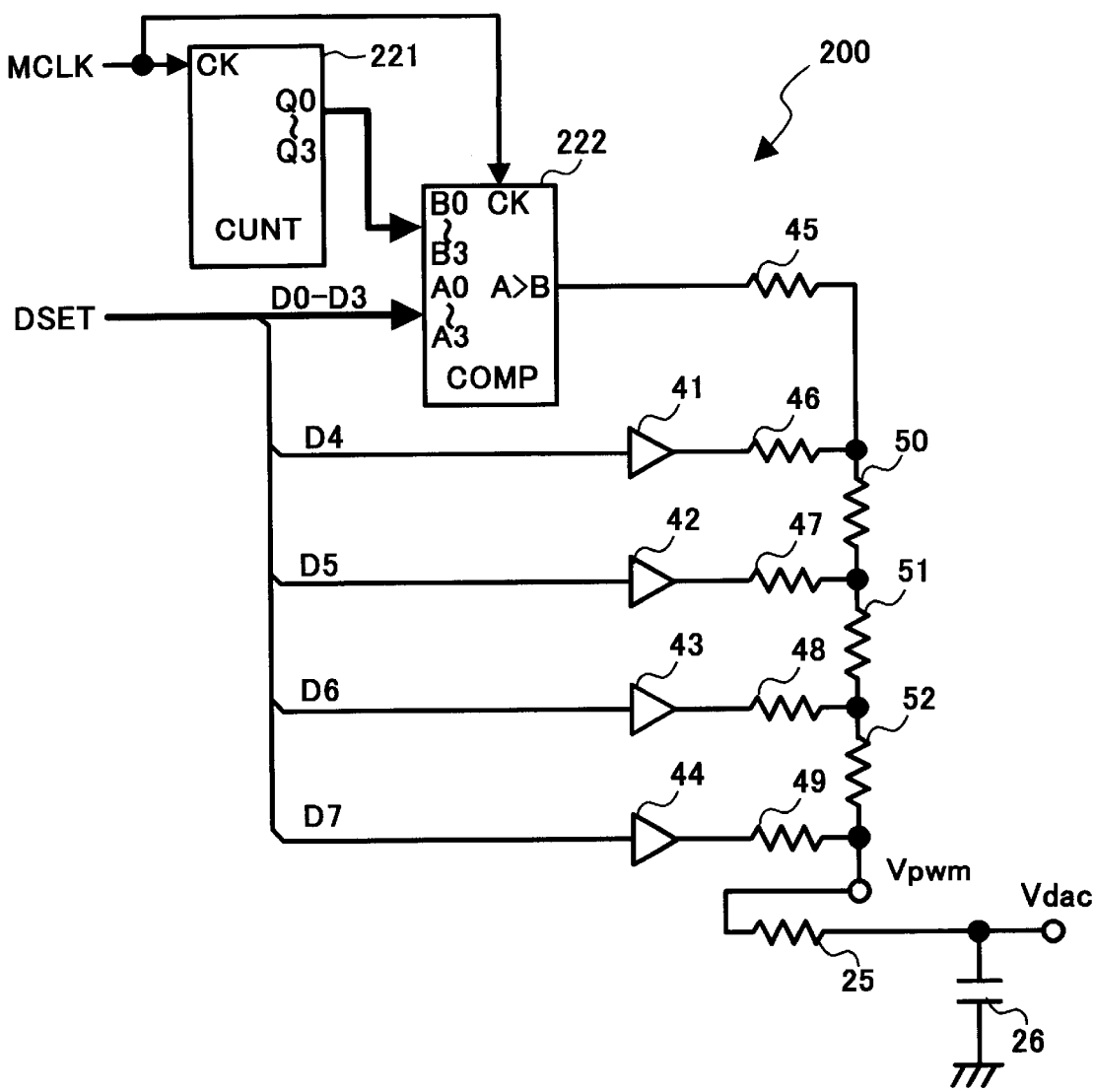
FIG. 9 is a schematic circuit diagram of the digital-to-analog converter of FIG. 8.

FIG. 9 shows further details of the structure of the DA converter 200. As shown in FIG. 9, the DA converter 200 is provided with a four-bit counter (CUNT) 221 for counting the main clock signal MCLK and a four-bit magnitude comparator (COMP) 222 for comparing an output from the four-bit counter 221 with the input data set DSET. The DA converter 200 and the four-bit counter 221 configure the PWM signal generator 8a of FIG. 8. The DA converter 200 further includes buffer elements 41–44 and resistors 45–52, which configure the amplitude regulator 15, the low-level regulator 16, and the voltage adder 17 of FIG. 8. The resistors 45–49 have a resistance value of 2R, and the resistors 50–52 have a resistance value of R so that the resistors 45–52 in total form an R–2R ladder resistor. The DA converter 200 further includes the resistor 25 and the capacitor 26, constituting the smoothing circuit 10 as described above.

In the DA converter 200, a number of DAC bits is set to eight and a number of voltage levels for Vdac is set to sixteen. The magnitude comparator 222 outputs a high signal from an output terminal A>B when an input A is greater than an input B. The magnitude comparator 222 has input terminals A0–A3 for receiving the lower bits D0–D3, respectively, of the input data set DSET and input terminals B0–B3 for receiving the outputs Q0–Q3, respectively, of the counter 221. The upper bits D4–D7 of the input data set DSET are input to the buffer elements 41–44, respectively. The output A>B of the magnitude comparator 222 and the outputs of the buffer elements 41–44 are input to the R–2R ladder including the resistors 45–52. The R–2R ladder outputs a resultant pulse signal Vpwm which is smoothed by the smoothing circuit 10 including the resistor 25 and the capacitor 26. As a result, a desired analog voltage Vdac is output in response to the input data set DSET.

Figure 10:
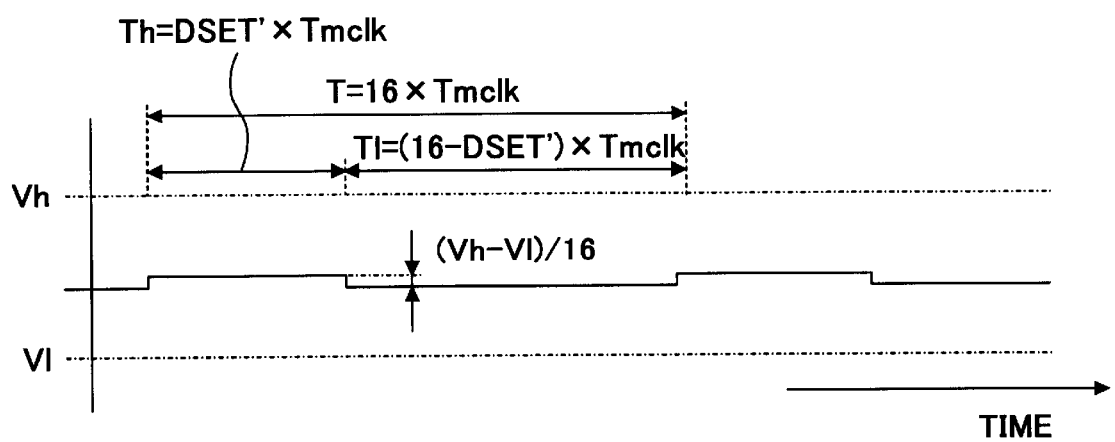
FIG. 10 is a time chart for explaining a pulse width modulation performed by the digital-to-analog converter of FIG. 8.

The resultant pulse signal Vpwm is varied in sixteen levels through the R–2R ladder in accordance with the output A>B of the magnitude comparator 222 and the output levels of the buffer elements 41–44. That is, the resultant pulse signal Vpwm is varied by following calculations:

when the output A>B is low, $Vpwm=(Vh-Vl)\times D/16+Vl$; and when the output A>B is high, $Vpwm=(Vh-Vl)\times(D+1)/16+Vl$, where Vh represents a high level of each Vpwm, Vl represents a low level of each Vperm, D represents a value of the four bits from D4 (LSB) to D7 (MSB). Thus, the upper four bits D4–D7 of the eight-bit input data set DSET regulate the low level of the pulse signal Vpwm, in which the amplitude is maintained constant, and the lower four bits D0–D3 modulate the pulse signal Vpwm. As a result, the pulse signal Vpwm is made as shown in FIG. 10. Table 1 of FIG. 11 shows the sixteen levels made with the upper four bits D4–D7 of the input data set DSET, the output A>B, and the output voltage Vpwm.

Figure 12:
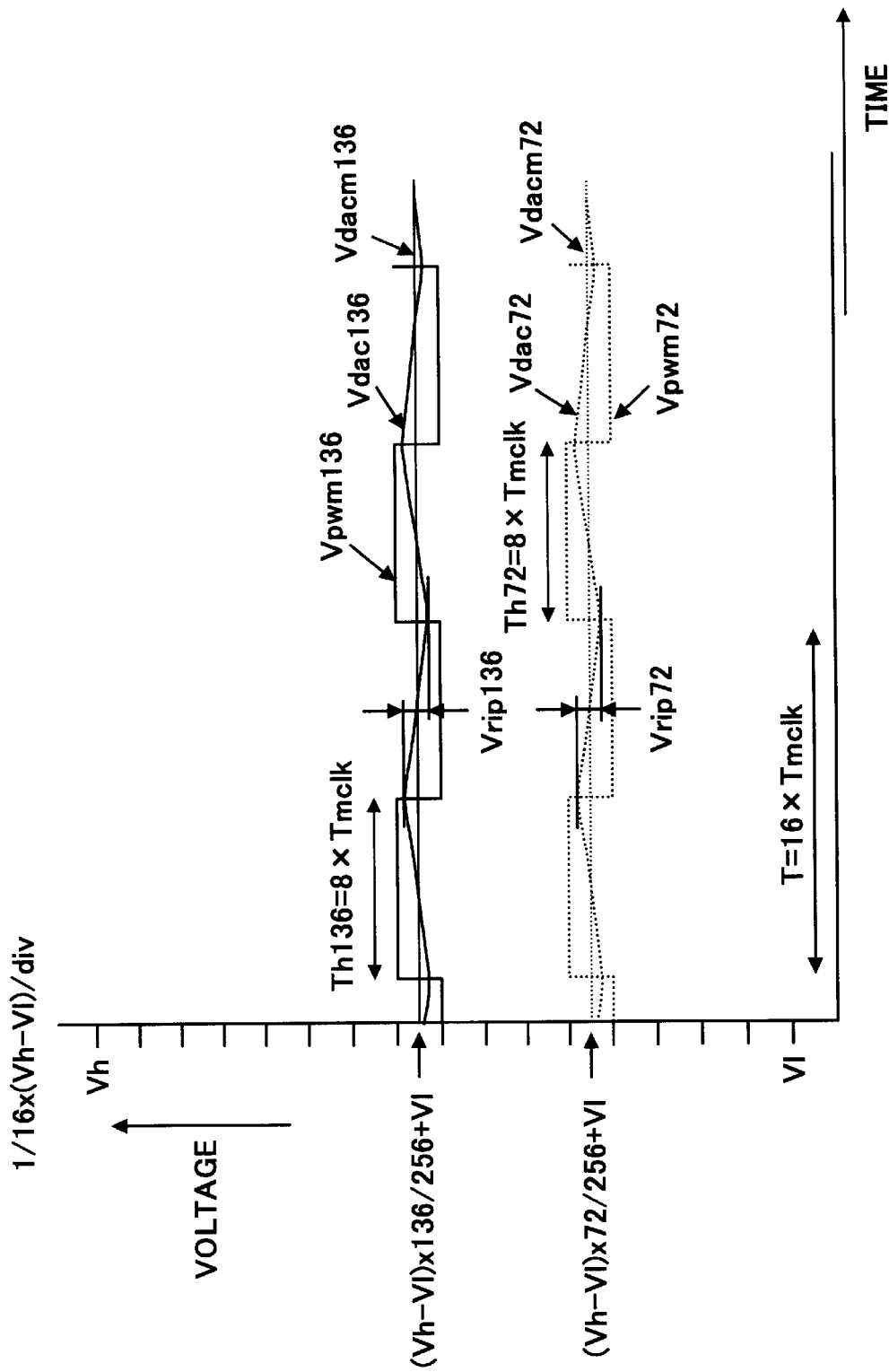
FIG. 12 is a time chart for explaining the pulse width modulation performed by the digital-to-analog converter of FIG. 8 when an input data set is 136 and 72.

FIG. 12 is a time chart showing a relationship between the pulse signal Vpwm and the analog voltage Vdac in two exemplary cases at the same time. In one case, the value of the data set DSET is set to 136, for example, and the related signal and waveform are labeled with a suffix numeral 136. In the other case, the value of the data set DSET is set to 72, for example, and the related signal and waveform are labeled with a suffix numeral 72. For example, Vpwm136 indicates as the pulse signal Vpwm in the case where the data set DSET is set to 136, and Vpwm72 indicates as the pulse signal Vpwm in the case where the data set DSET is set to 72.

Thus, in the above-described structure of the DA converter 200, the pulse width modulation cycle Tpwm is divided into sixteen parts in the pulse width modulation, that is, a ripple frequency is increased to sixteen times the ripple frequency of the background DA converter. Also, the difference between the voltages Vh and Vl is divided into sixteen levels. In addition, allowable variations of the analog voltage Vdac in high and low remain same as those in the background DA converter. Accordingly, in the DA converter 200, the time constant of the RC circuit can be reduced to 1/256 (=(1/16)×(1/16)), and consequently the response time can be reduced to 1/256.

The difference between the voltages Vh and Vl can be divided into arbitrary levels. However, the above-described structure is achieved when a division number is smaller than a value of 2 raised to the n minus one power, in which n represents a number of bits of the DAC. The R–2R ladder resistor includes resistors 45–52 which can be integrated in an integrated circuit (IC) chip.

Figure 13:
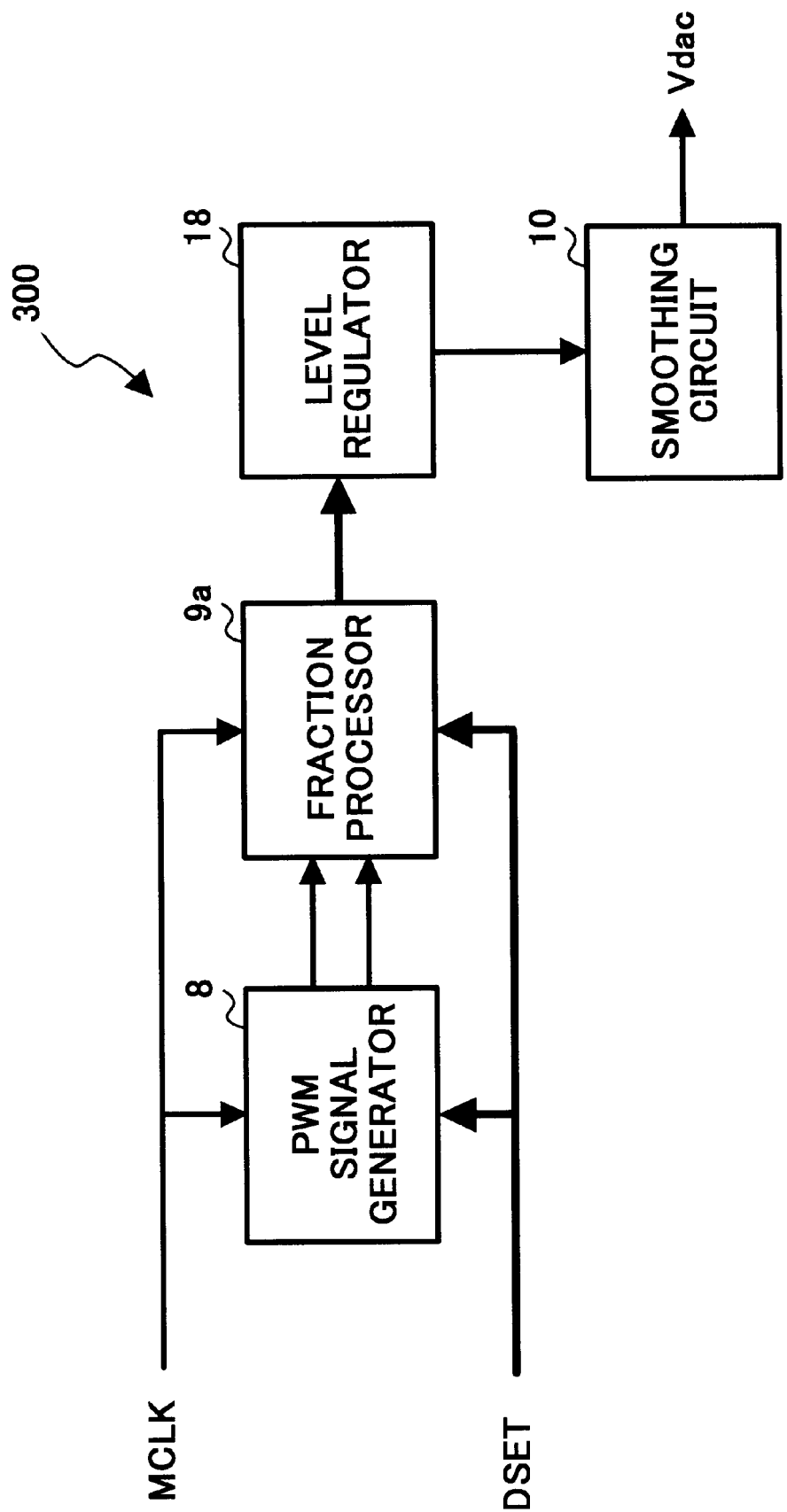
FIG. 13 is a schematic block diagram of a digital-to-analog converter according to another preferred embodiment of the present invention.

Next, a digital-to-analog (DA) converter 300 according to another preferred embodiment of the present invention is explained with reference to FIG. 13. As shown in FIG. 13, the DA converter 300 includes the PWM signal generator 8, a fraction processor 9a, a level regulator 18, and the smoothing circuit 10.

The PWM signal generator 8 receives a main clock signal MCLK and upper bits of the input data set DSET. The PWM signal generator 8 performs a pulse width modulation modulating the input data set DSET with a counter for counting the main clock signal MCLK, and outputs a resultant analog voltage and a PWM cycle signal to the fraction processor 9a. In addition to these signals, the fraction processor 9a also receives the main clock signal MCLK and lower bits of the input data set DSET. The fraction processor 9a performs a PWM cycle division and, when a fraction is produced by the PWM cycle division, splits and distributes the fraction to each of the divided cycles. The fraction processor 9a outputs multi-bit Pwm signals to the level regulator 18. The level regulator 18 regulates the level of the multi-bit Pwm signals. The smoothing circuit 10 smoothes the resultant analog voltage and outputs a desired analog voltage Vdac in response to a value of the input data set DSET.

Figure 14:
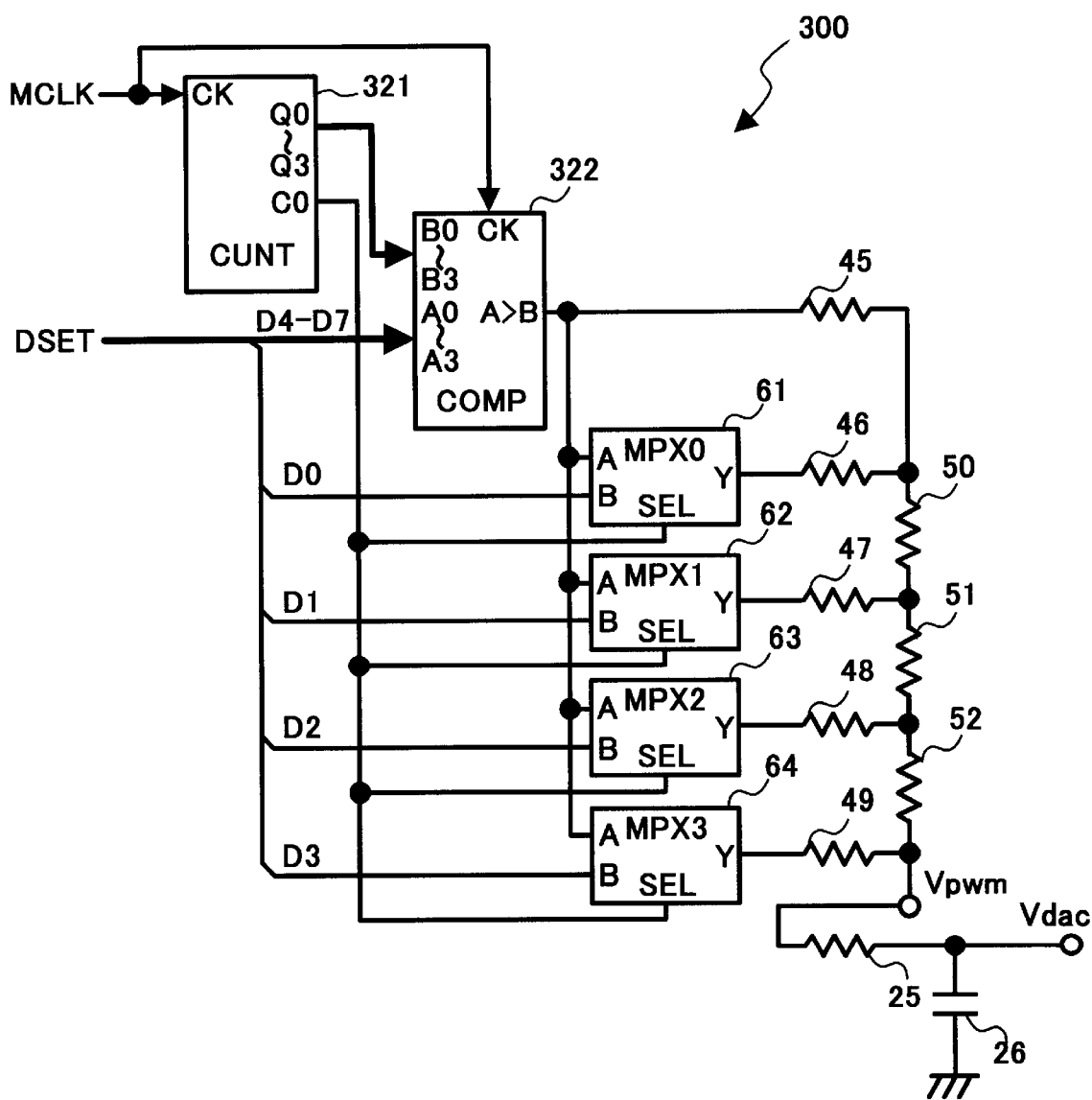
FIG. 14 is a schematic circuit diagram of the digital-to-analog converter of FIG. 13.

FIG. 14 shows further details of the structure of the DA converter 300. As shown in FIG. 14, the DA converter 300 is provided with a four-bit counter (CUNT) 321 for counting the main clock signal MCLK and a four-bit magnitude comparator (COMP) 322 for comparing an output from the four-bit counter 321 with the input data set DSET. The four-bit counter and the four-bit magnitude comparator configure the PWM signal generator 8a of FIG. 10. The DA converter 300 further includes multiplexers (MPX#) 61–64 constituting the fraction processor 9a of FIG. 10, and the resistors 45–52 constituting the level regulator 18 of FIG. 10. The DA converter 300 further includes resistor 25 and capacitor 26, constituting the smoothing circuit 10. As described above, the resistors 45–49 have a resistance value of 2R, and the resistors 50–52 have a resistance value of R so that the resistors 45–52 in total form the R–2R ladder resistor. With this R–2R ladder resistor, the output A>B of the magnitude comparator 322 and the output Y of the MPX0 are assigned with a weight of 1/16. Likewise, the outputs Y of the MPX1–MPX3 are assigned with weights of 1/8, 1/4, and 1/2, respectively.

In the DA converter 300, a number of DAC bits is set to eight and a number of voltage levels for Vdac is set to sixteen. The magnitude comparator 322 outputs a high signal from an output terminal A>B when an input A is greater than an input B. The magnitude comparator 322 has input terminals A0-A3 for receiving the upper bits D4–D7, respectively, of the input data set DSET and input terminals B0–B3 for receiving the outputs Q0–Q3, respectively, of the counter 321. The lower bits D0–D3 of the input data set DSET are input to the multiplexers 61–64, respectively. The output CO (carry over) of the counter 321 is high when the outputs Q0–Q3 are all high. The output CO is input to selection terminals SEL of the multiplexers 61–64 so that the multiplexers 61–64 select the output A>B when the output CO is low and the multiplexers 61–64 select the data of the lower bits D0–D3 of DSET. The output A>B of the magnitude comparator 222 and the outputs of the multiplexers 61–64 configure multi-bit pwm signals to be input to the R–2R ladder which includes resistors 45–52. The R–2R ladder outputs a resultant pulse signal Vpwm which is smoothed by the smoothing circuit 10 including the resistor 25 and the capacitor 26. As a result, a desired analog voltage Vdac is output in response to the input data set DSET.

The resultant pulse signal Vpwm is varied in sixteen levels through the R–2R ladder in accordance with the output A>B of the magnitude comparator 322 and the output levels of the multiplexers 61–64. That is, the resultant pulse signal Vpwm is varied by following calculations:

when the output CO is low and the output A>B is low, $Vpwm=Vl$;

when the output CO is low and the output A>B is high, $Vpwm=Vh$;

when the output CO is high and the output A>B is low, $Vpwm=(Vh-Vl)\times MPX/16+Vl$;

and when the output CO is low and the output A>B is high, $Vpwm=(Vh-Vl)\times (MPX+1)/16+Vl$, where Vh represents a high level of each Vpwm, Vl represents a low level of each Vperm, MPX represents a value of the multiplexers 61–64 from MPX0 (LSB) to MPX3 (MSB). Thus, the upper four bits D4–D7 of the eight-bit input data set DSET regulate the high level of the pulse signal Vpwm having an amplitude of the voltages Vh and Vl, and the lower four bits D0–D3 determine the high level of the pulse signal Vpwm when the output CO is high, that is, the sixteenth time period of the PWM cycle. Table 2 of FIG. 15 shows the sixteen levels made with the outputs of the multiplexers 61–64, the output A>B, and the output voltage Vpwm.

Figure 16:
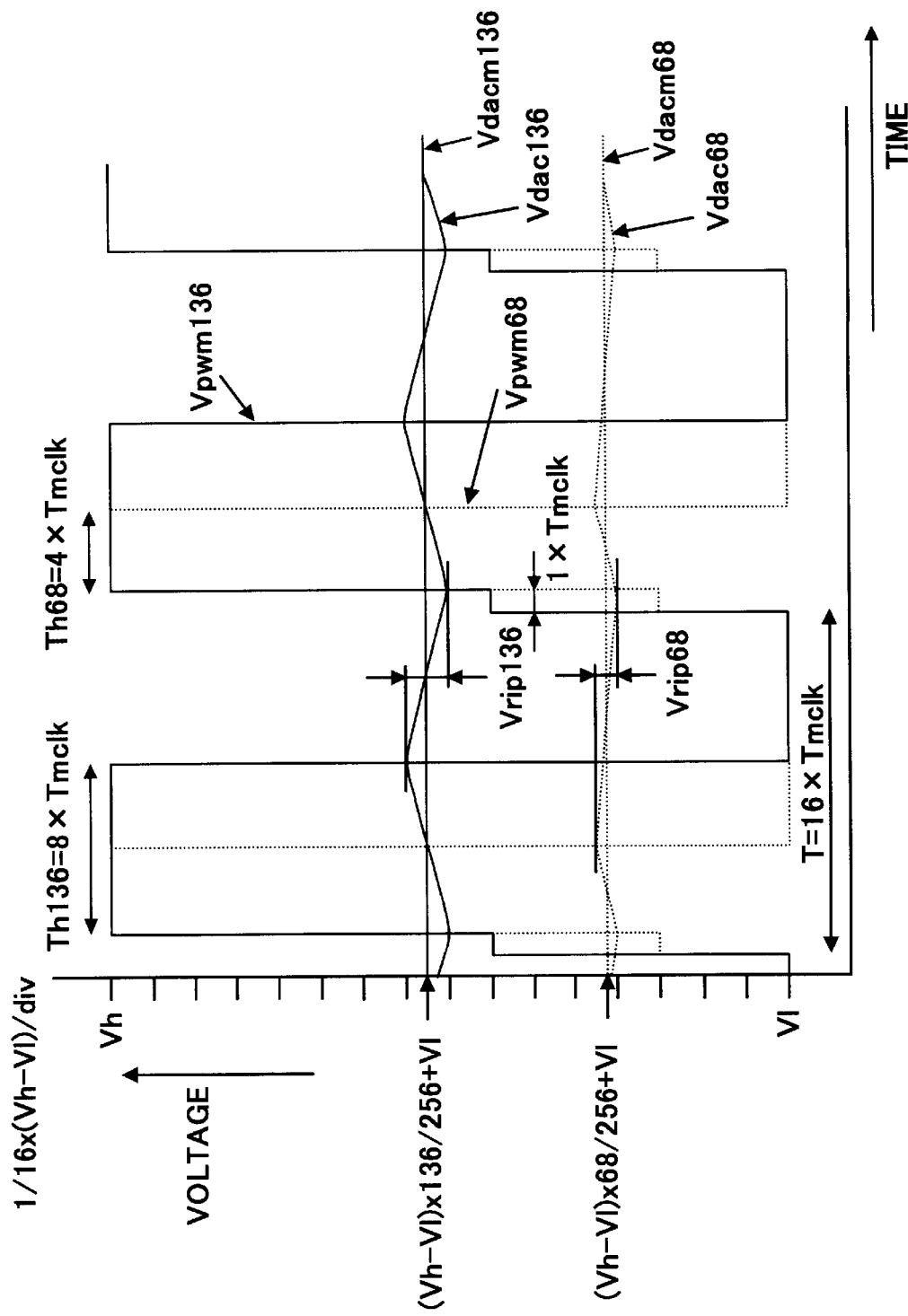
FIG. 16 is a time chart for explaining the pulse width modulation performed by the digital-to-analog converter of FIG. 13 when an input data set is 136 and 68.

FIG. 16 is a time chart showing a relationship between the pulse signal Vpwm and the analog voltage Vdac in two exemplary cases at the same time. In one case, the value of the data set DSET is set to 136, for example, and the related signal and waveform are labeled with a suffix numeral 136. In the other case, the value of the data set DSET is set to 68, for example, and the related signal and waveform are labeled with a suffix numeral 68. For example, Vpwm136 indicates a pulse signal Vpwm in the case where the data set DSET is set to 136, and Vpwm68 indicates a pulse signal Vpwm in the case where the data set DSET is set to 68.

Thus, in the above-described structure of the DA converter 300, the pulse width modulation cycle Tpwm is divided into sixteen parts in the pulse width modulation, that is, a ripple frequency is increased to sixteen times the ripple frequency of the background DA converter. In addition, allowable variations of the analog voltage Vdac in high and low remain same as those in the background DA converter. Accordingly, in the DA converter 300, the time constant of the RC circuit can be reduced to one sixteenth, and consequently the response time can be reduced to one sixteenth.

The difference between the voltages Vh and Vl can be divided into arbitrary levels. However, it should be noted that the above-described structure is achieved when a division number is smaller than a value of 2 raised to the n minus one power, in which n represents a number of bits of the DAC. The R–2R ladder resistor includes resistors 45–52 which can be integrated in an IC (integrated circuit) chip.

Figure 17:
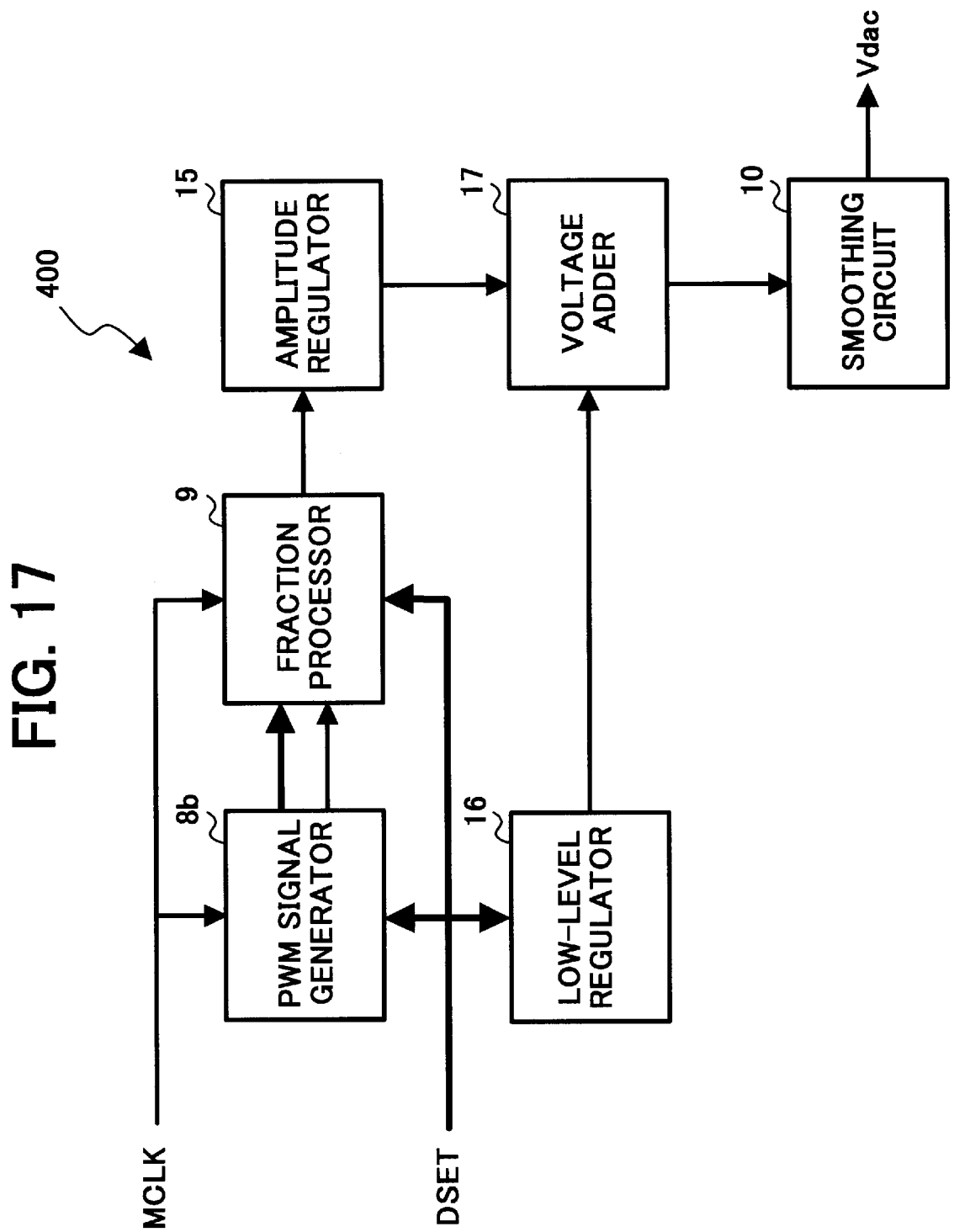
FIG. 17 is a schematic block diagram of a digital-to-analog converter according to another preferred embodiment of the present invention.

Next, a digital-to-analog (DA) converter 400 according to another preferred embodiment of the present invention is explained with reference to FIG. 17. As shown in FIG. 17, the DA converter 400 includes a PWM pulse width modulation) signal generator 8b, a fraction processor 9, an amplitude regulator 15, a low-level regulator 16, a voltage adder 17, and the smoothing circuit 10. The smoothing circuit 10 is the one described in the discussion of the DA converter 400.

The PWM signal generator 8b receives a main clock signal MCLK and middle bits of the input data set DSET. The PWM signal generator 8b performs a pulse width modulation relative to the input data set DSET with a counter for counting the main clock signal MCLK, and outputs a PWM signal and a PWM cycle signal to the fraction processor 9. In addition to these signals, the fraction processor 9 also receives the main clock signal MCLK and middle bits of the input data set DSET. The fraction processor 9 performs a PWM cycle division and, when a fraction is produced by the PWM cycle division, splits and distributes the fraction to each of the divided cycles. The fraction processor 9 outputs a resultant analog voltage to the amplitude regulator 15. The amplitude regulator 15 regulates an amplitude of the PWM signal and outputs a voltage to the voltage adder 17. The low-level regulator 16 regulates and outputs a relatively low level voltage to the voltage adder 17. The voltage adder 17 adds the voltage from the amplitude regulator 15 and the low-level voltage from the low-level regulator 16, and outputs a composite analog voltage to the smoothing circuit 10. The smoothing circuit 10 smoothes the composite analog voltage and outputs a desired analog voltage Vdac in response to a value of the input data set DSET.

Figure 18:
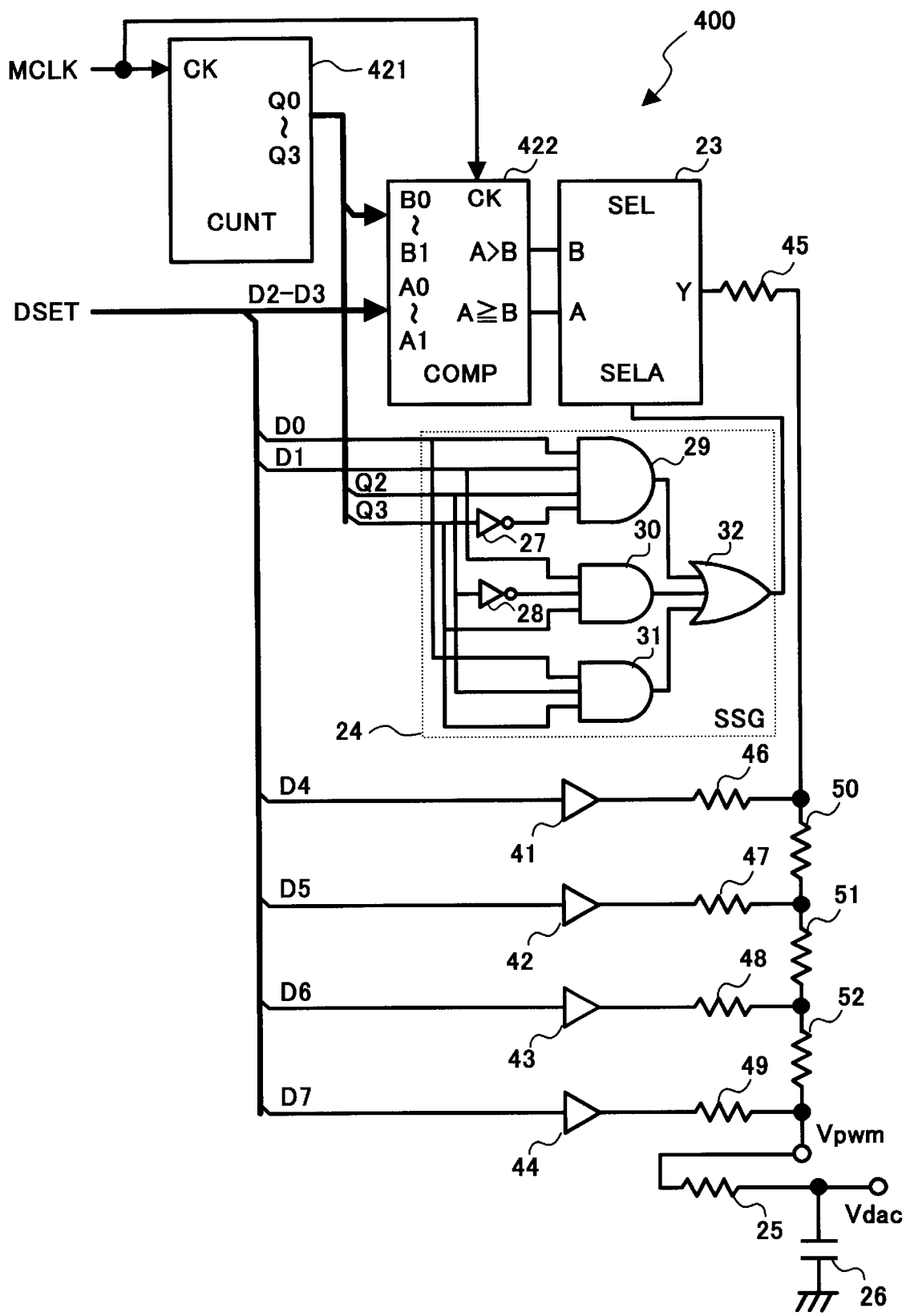
FIG. 18 is a schematic circuit diagram of the digital-to-analog converter of FIG. 17.

FIG. 18 shows further details of the structure of the DA converter 400. As shown in FIG. 18, the DA converter 400 is provided with a four-bit counter (CUNT) 421 for counting the main clock signal MCLK and a two-bit magnitude comparator (COMP) 422 for comparing outputs Q0 and Q1 from the four-bit counter 421 with inputs D2 and D3 of the input data set DSET. The DA converter 400 further includes a selection signal generator 24 including inverters 27 and 28, NAND gates 29–31, and an OR gate 32. The lower two bits Q0 and Q1 of the counter 421 and the output A>B of the comparator 422 configure the PWM signal generator 8b of FIG. 17. Upper two bits Q2 and Q3 of the counter 421, the output A≧B of the comparator 422, the data selector 23, and the selection signal generator 24 configure the fraction processor 9 of FIG. 17. The DA converter 400 further includes the buffer elements 41–44 and the resistors 45–52, which configure the amplitude regulator 15, the low-level regulator 16, and the voltage adder 17 of FIG. 17. The resistors 45–49 have a resistance value of 2R, and the resistors 50–52 have a resistance value of R so that the resistors 45–52 in total form an R–2R ladder resistor. The DA converter 400 further includes the resistor 25 and the capacitor 26, configuring the smoothing circuit 10 as described above.

In the DA converter 400, a number of DAC bits is set to eight, the upper four bits D4–D7 of the input data set DSET are used for the low-level regulation, and the PWM cycle is divided into four cycles. That is, the DA converter 400 is a combination of the DA converter 100 and the DA converter 200.

Figure 19:
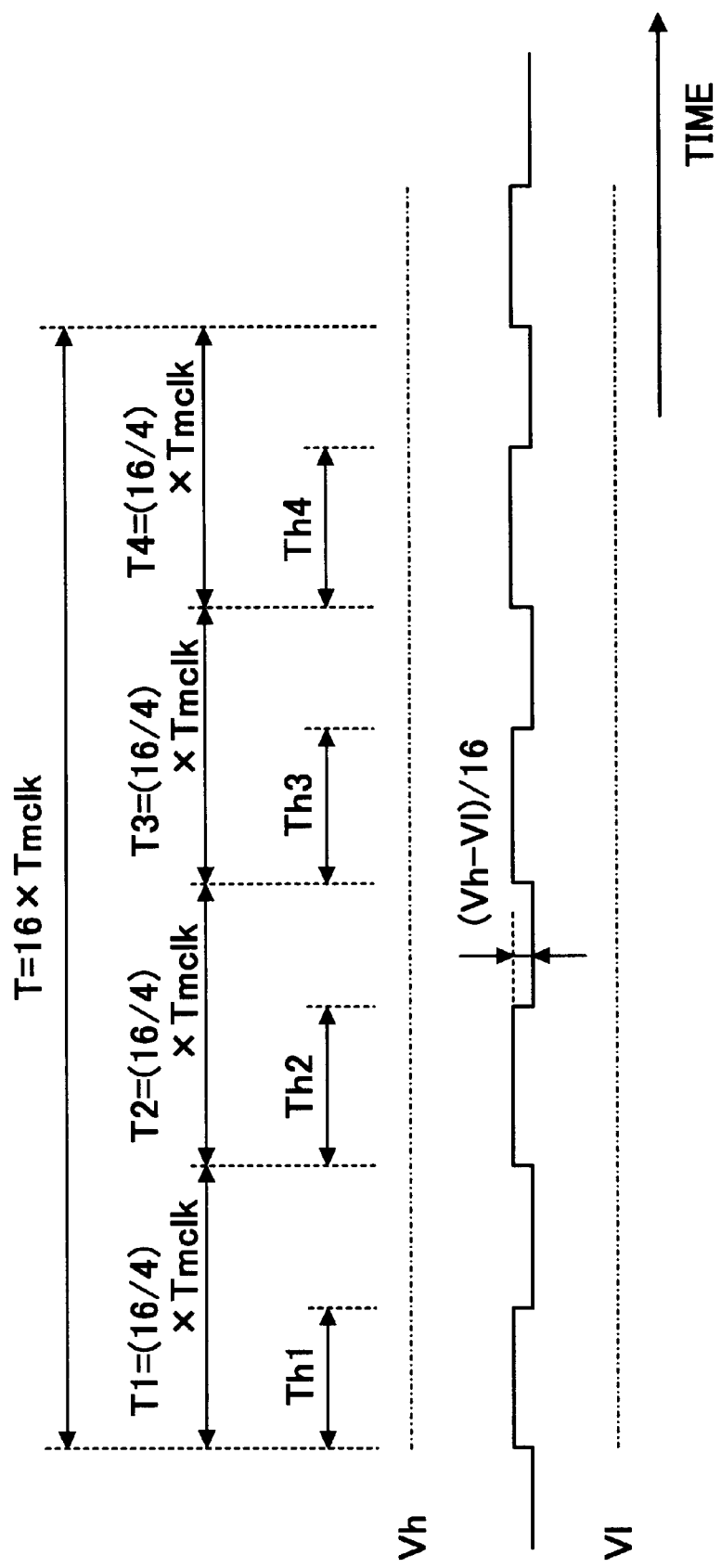
FIG. 19 is a time chart for explaining a pulse width modulation performed by the digital-to-analog converter of FIG. 17.

The magnitude comparator 422 outputs a high signal from an output terminal A>B when an input A is greater than an input B. The magnitude comparator 222 has input terminals A0 and A1 receiving the middle bits D2 and D3, respectively, of the input data set DSET and input terminals B0 and B1 receiving the outputs Q0 and Q1, respectively, of the counter 421. The upper two bits Q2 and Q3 and the lower bits D0 and D1 of the input data set DSET are input to the selection signal generator 24 which generates a selection signal and outputs it to the data selector 23. The high signal from the A>B output terminal is input to an input terminal B of the data selector 23, and the high signal from the A≧B output terminal is input to an input terminal A of the data selector 23. The data selector 23 enables the input terminal A when a selection terminal SELA is high and the input terminal B when SELA is low. The data selector 23 outputs a pulse signal Vpwm. The upper bits D4–D7 of the input data set DSET are input to the buffer elements 41–44, respectively. The output A>B of the magnitude comparator 422 and the outputs of the buffer elements 41–44 are input to the R–2R ladder including the resistors 45–52. The R–2R ladder outputs a resultant pulse signal Vpwm which is smoothed by the smoothing circuit 10 including the resistor 25 and the capacitor 26. As a result, a desired analog voltage Vdac is output in response to the input data set DSET. FIG. 19 shows an example of the pulse signal Vpwm output from the smoothing circuit 10. In this example, the pulse width modulation cycle Tpwm includes 16 Tmclk and, as shown in FIG. 19, each of pulse widths T1–T4 of the pulse width modulation cycle Tpwm is 4 Tmclk. The pulse widths T1–T4 in a high level are defined in the following manners, in which "into" indicates an operation that a value enclosed by brackets is made an integer through a decimal round down, that is, a value smaller than a decimal point is rounded down. Also, in the following calculations, terms DSET' and DSET" are defined as follows;

$$DSET'=DSET-int(DSET/16)\times16,$$

and $$DSET''=DSET'-int(DSET'/4)\times4.$$

A difference between the maximum and the minimum of Th1–Th4 is smaller than one Tmclk:

T1; Th1=int(DSE'/4)×Tmclk,

T2; Th2=Th1+int(DSET"/3)×Tmclk,

T3; Th3=Th1+int(DSET"/2)×Tmclk, and

T4; Th4=Th1+DSET"−int(DSET"/2)×2×Tmclk.

Figure 20:
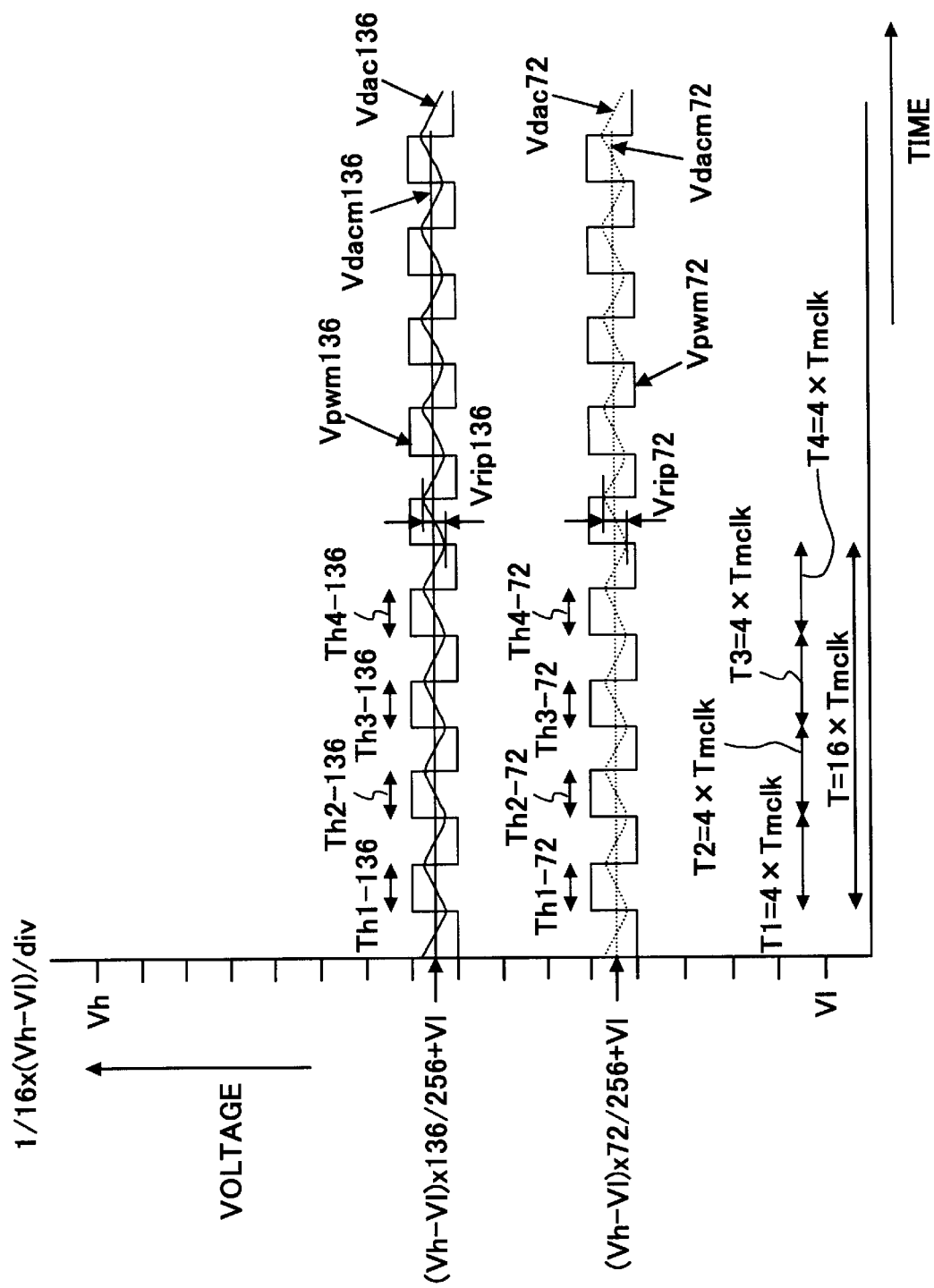
FIG. 20 is a time chart for explaining the pulse width modulation performed by the digital-to-analog converter of FIG. 17 when an input data set is 136 and 72.

FIG. 20 is a time chart showing a relationship among the pulse signal Vpwm, the analog voltage Vdac, and the ripple voltage Vrip when the value of the data set DSET is set to 136, for example, and when the value of the data set DSET is set to 72, for example, at the same time.

Thus, in the DA converter 400, the PWM cycle Tpwm is 16 Tmclk, and each of the divided time lengths T1–T4 is 4 Tmclk. Therefore, the DA converter 400 can reduce a time for holding a high level or a low level to 1/64 in comparison to those performances of the background DA converter. In addition, the voltage level is reduced to 1/16 in comparison to that of the background DA converter. Since allowable variations of the analog voltage Vdac in high and low remain same as those in the background DA converter, the DA converter 400 can reduce the time constant of the RC circuit to 1/1024(=(1/64)×(1/16)), and consequently the response time can be reduced to 1/1024.

Figure 21:
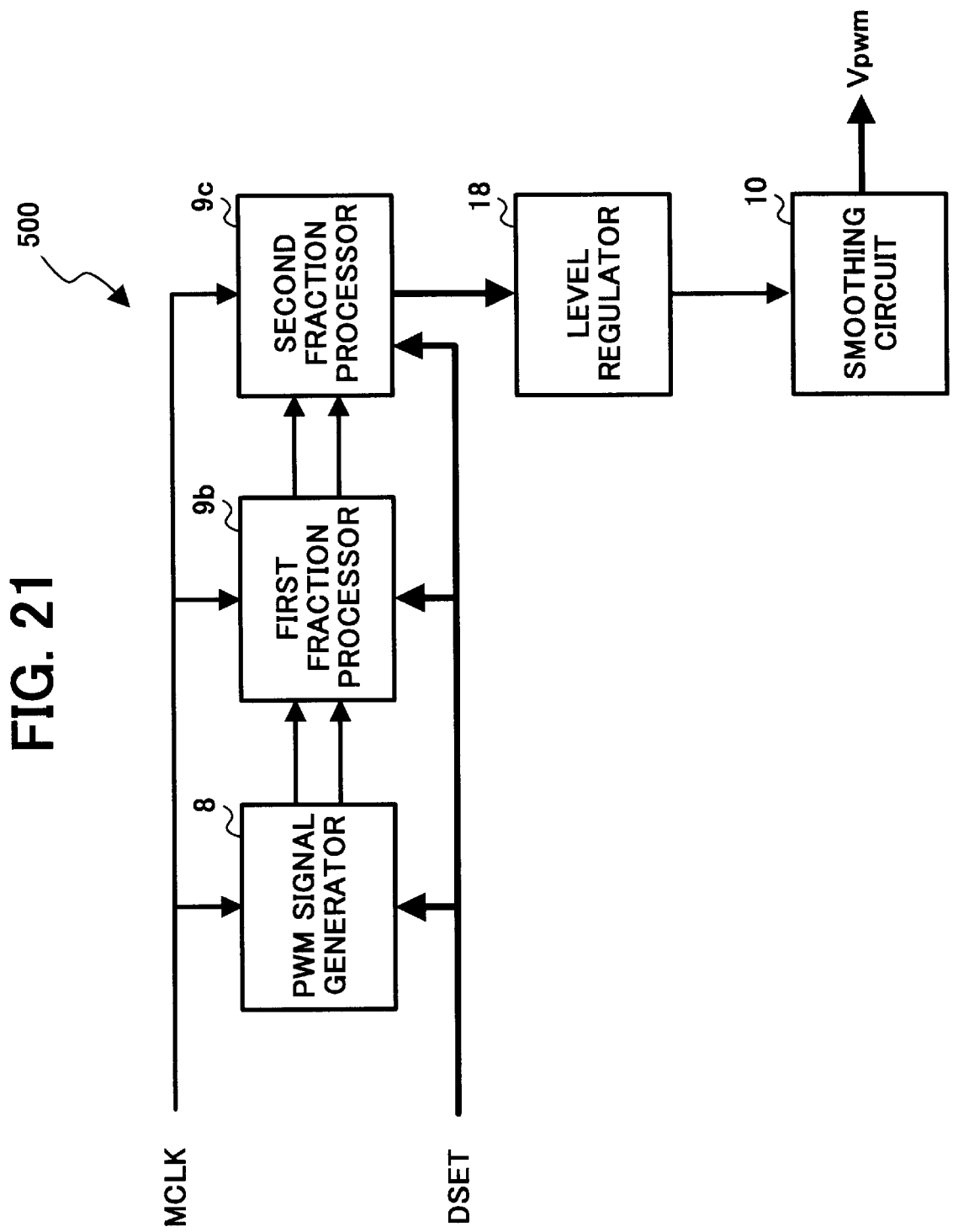
FIG. 21 is a schematic block diagram of a digital-to-analog converter according to another preferred embodiment of the present invention.

Next, a digital-to-analog (DA) converter 500 according to another preferred embodiment of the present invention is explained with reference to FIG. 21. As shown in FIG. 21, the DA converter 500 includes a PWM signal generator 8, a first fraction processor 9b, a second fraction processor 9c, the level regulator 18, and the smoothing circuit 10.

The PWM signal generator 8 receives a main clock signal MCLK and upper bits of the input data set DSET. The PWM signal generator 8 performs a pulse width modulation relative to the input data set DSET with a counter for counting the main clock signal MCLK, and outputs a PWM signal and a PWM cycle signal to the first fraction processor 9b. In addition to these signals, the first fraction processor 9b also receives the main clock signal MCLK and middle bits of the input data set DSET. The first fraction processor 9b performs a PWM cycle division and outputs a divided PWM signal and a PWM cycle signal. The second fraction processor 9c receives the main clock signal, the lower bits of the input data set DSET, as well as the divided PWM signal and the PWM cycle signal. Based on these signals, the second fraction processor 9c outputs a multi-bit PWM signal. The level regulator 18 regulates the level of the multi-bit PWM signal and outputs an analog voltage to the smoothing circuit 10. The smoothing circuit 10 smoothes the analog voltage and outputs a desired analog voltage Vdac in response to a value of the input data set DSET.

Figure 22:
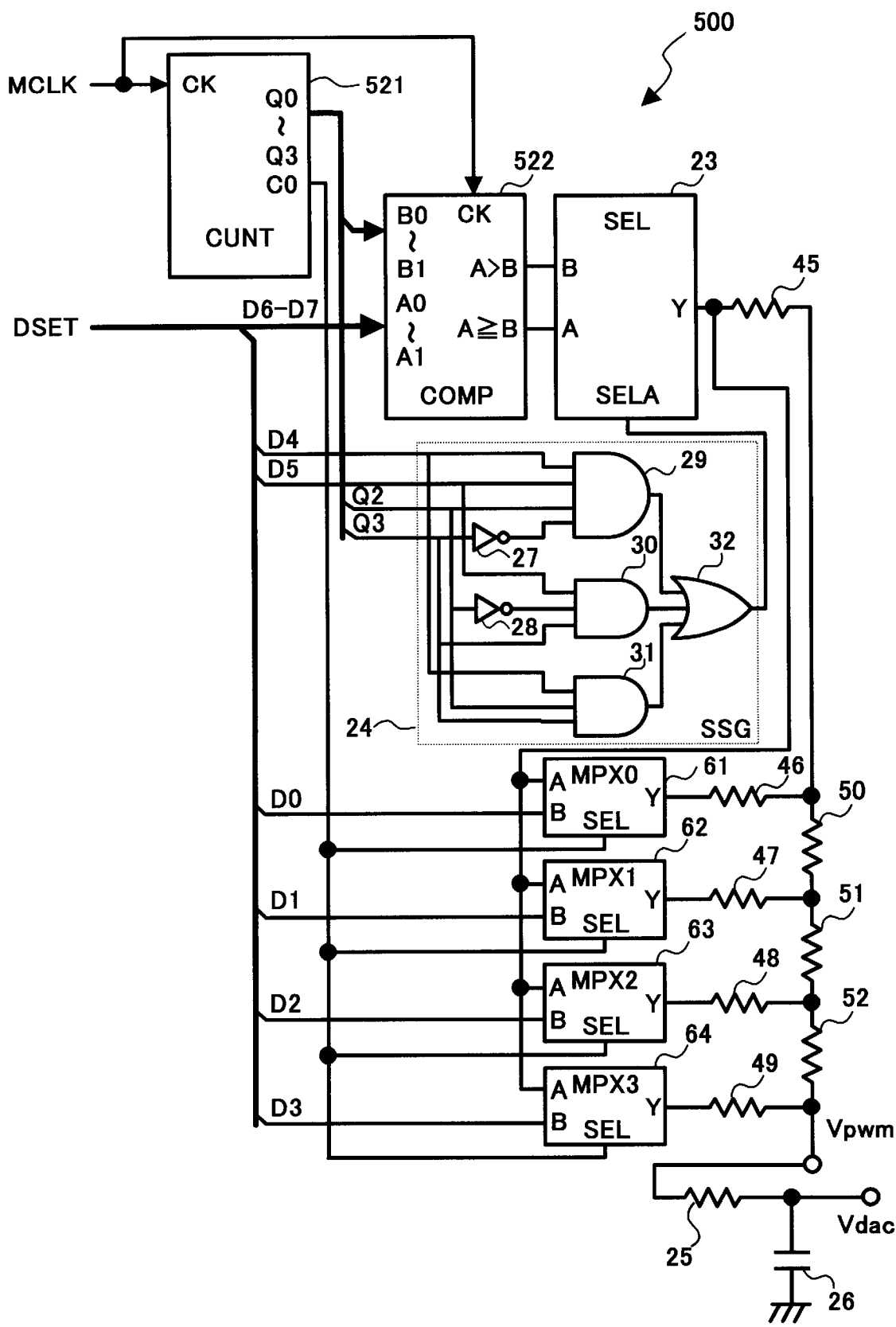
FIG. 22 is a schematic circuit diagram of the digital-to-analog converter of FIG. 21.

FIG. 22 shows further details of the structure of the DA converter 500. As shown in FIG. 22, the DA converter 500 is provided with a four-bit counter (CUNT) 521 for counting the main clock signal MCLK and a two-bit magnitude comparator (COMP) 522 for comparing outputs Q0 and Q1 from the four-bit counter 521 with inputs D6 and D7 of the input data set DSET. The DA converter 500 further includes selection signal generator 24 including inverters 27 and 28, NAND gates 29–31, and an OR gate 32. The lower two bits Q0 and Q1 of the counter 521 and the output A>B of the comparator 522 configure the PWM signal generator 8 of FIG. 21. Upper two bits Q2 and Q3 of the counter 521, the output A≧B of the comparator 522, the data selector 23, and the selection signal generator 24 configure the first fraction processor 9b of FIG. 21. The DA converter 500 further includes multiplexers (MPX#) 61–64 configuring the second fraction processor 9c of FIG. 21 and resistors 45–52 configuring the level regulator 18 of FIG. 21. The resistors 45–49 have a resistance value of 2R, and the resistors 50–52 have a resistance value of R so that the resistors 45–52 in total form an R–2R ladder resistor. The DA converter 500 further includes the resistor 25 and the capacitor 26, constituting the smoothing circuit 10 as described above.

In the DA converter 500, a number of DAC bits is set to eight, the upper four bits D4–D7 of the input data set DSET are used for the four-way division of the PWM cycle, and a unit width in a high state in response to the lower four bits D0–D3 of the input data set DSET is added to the PWM cycle. That is, the DA converter 500 is a combination of the DA converter 100 and the DA converter 300.

The magnitude comparator 522 outputs a high signal from an output terminal A>B when an input A is greater than an input B. The magnitude comparator 522 has input terminals A0 and A1 receiving the upper bits D6 and D7, respectively, of the input data set DSET and input terminals B0 and B1 receiving the outputs Q0 and Q1, respectively, of the counter 521. The upper two bits Q2 and Q3 and the middle bits D4 and D5 of the input data set DSET are input to the selection signal generator 24 which generates a selection signal and outputs the selection signal to the data selector 23. The high signal from the A>B output terminal is input to an input terminal B of the data selection 23, and the high signal from the A≧B output terminal is input to an input terminal A of the data selection 23. The data selector 23 enables the input terminal A when a selection terminal SELA is high and the input terminal B when SELA is low. The data selector 23 outputs a pulse signal Vpwm. The lower bits D0–D3 of the input data set DSET are input to the multiplexers 61–64, respectively. The output CO of the counter 521 is high when the outputs Q0–Q3 are all high. The output CO is input to selection terminals SEL of the multiplexers 61–64 so that the multiplexers 61–64 select the output of the data selector 23 when the output CO is low and the multiplexers 61–64 select the data of the lower bits D0–D3 of DSET. The output of the data selector 23 and the outputs of the multiplexers 61–64 are input to the R–2R ladder including the resistors 45–52. The R–2R ladder outputs a resultant pulse signal Vpwm which is smoothed by the smoothing circuit 10 including the resistor 25 and the capacitor 26. As a result, a desired analog voltage Vdac is output in response to the input data set DSET.

Figure 23:
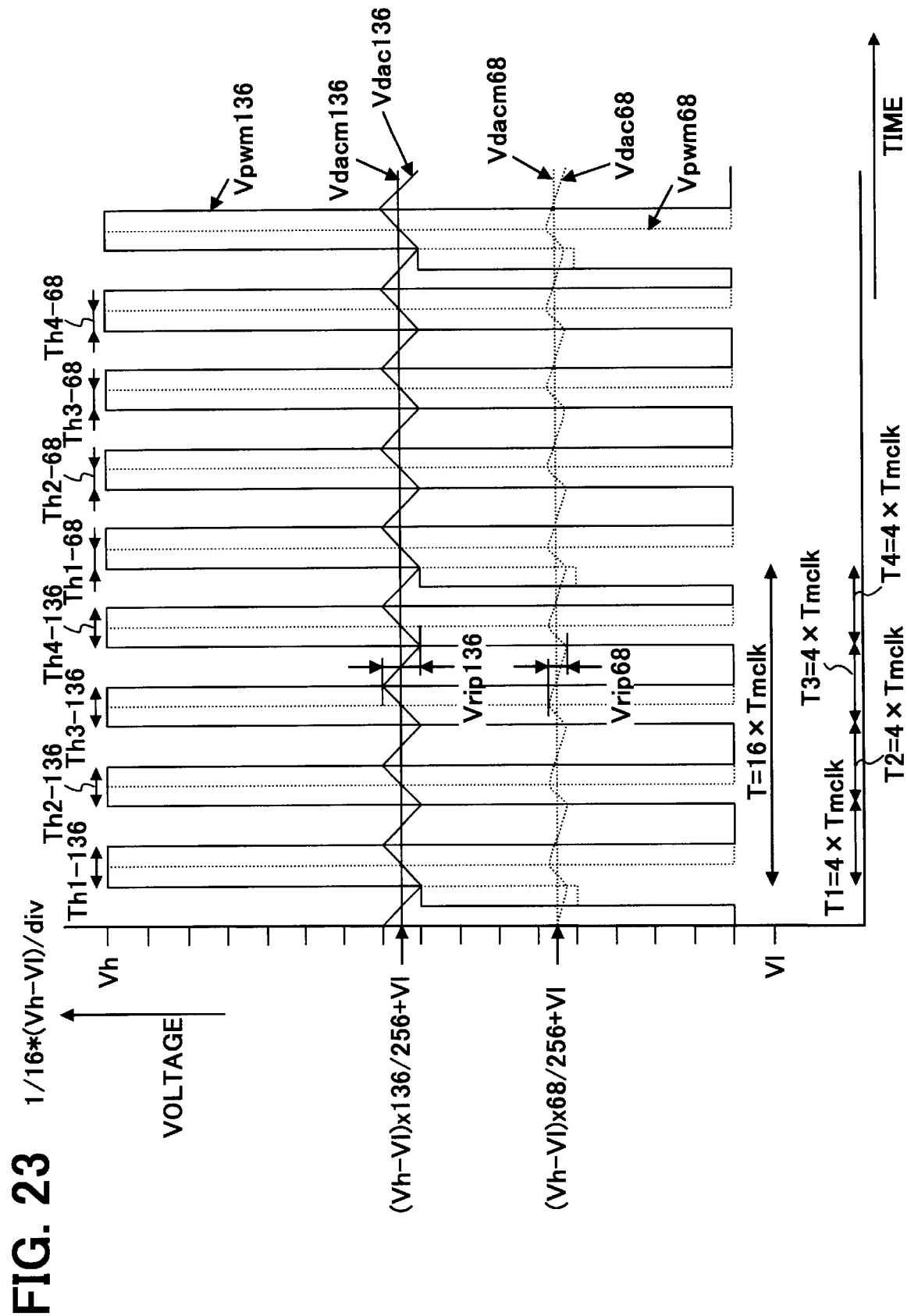
FIG. 23 is a time chart for explaining the pulse width modulation performed by the digital-to-analog converter of FIG. 17 when an input data set is 136 and 68.

FIG. 23 is a time chart showing a relationship among the pulse signal Vpwm, the analog voltage Vdac, and the ripple voltage Vrip when the value of the data set DSET is set to 136, for example, and when the value of the data set DSET is set to 68, for example, at the same time.

Thus, in the DA converter 500, the Pwm cycle Tpwm is 16 Tmclk, and each of the divided time lengths T1–T4 is 4 Tmclk. Therefore, the DA converter 500 can reduce a time for holding a high level or a low level to 1/64 in comparison to those performances of the background DA converter. Since allowable variations of the analog voltage Vdac in high and low remain same as those in the background DA converter, the DA converter 500 can reduce the time constant of the RC circuit to 1/64, and consequently the response time can be reduced to 1/64.

Numerous additional modifications and variations are possible in light of the above teachings. It is therefore to be understood that within the scope of the appended claims, the disclosure of this patent specification may be practiced otherwise than as specifically described herein.

What is claimed is:

1. A digital-to-analog converter for converting an n-bit digital data set including upper nh bits and lower nl bits to an analog voltage, comprising:

a signal generator configured to perform a pulse width modulation, to generate a first pulse-width-modulated signal having a plurality of first pulses, and to generate a pulse-width-modulation (pwm) cycle signal indicating a cycle of said pulse width modulation;

a low-weighted value manager configured to receive said first pulse-width-modulated signal, said pwm cycle signal, and the lower nl bits of said n-bit digital data set, and to divide a pulse width of the first pulse-width-modulated signal into a plurality of fraction pulse widths in response to a value of the lower nl bits of said n-bit digital data, to add said plurality of fraction pulse widths to respective of said plurality of the first pulses, and to generate a second pulse-width-modulated signal; and a voltage smoothing circuit configured to smooth said second pulse-width-modulated signal.

2. The converter of claim 1, wherein the signal generator is configured to perform said pulse width modulation based on inputs of a reference clock signal and the upper nh bits of said n-bit digital data set.

3. The converter of claim 2, wherein the signal generator comprises:

a counter configured to count the reference clock signal and output a counting value; and a magnitude comparator configured to receive the counting value, to compare the counting value to the upper nh bits, and to output, upon a value of the upper nh bits being greater than the counting value, said first pulse-width-modulated signal.

4. The converter of claim 1, wherein said plurality of first pulses comprises:

a first pulse width generated in response to a value of the upper nh bits of said n-bit digital data set.

5. The converter of claim 1, wherein said second pulse-width-modulated signal comprises:

a plurality of second pulses including said first pulse width and one of said plurality of fraction pulse widths.

6. A digital-to-analog converter for converting an n-bit digital data set including upper nh bits and lower nl bits to an analog voltage, comprising:

a signal generator configured to perform a pulse width modulation and to generate a pulse-width-modulated signal having a plurality of first pulses;

an amplitude regulator configured to regulate an amplitude of said pulse-width-modulated signal generated by said signal generator;

a bottom-level regulator configured to receive the upper nh bits of said n-bit digital data set and to regulate a bottom level of a voltage in accordance with a value of said upper nh bits of said n-bits digital data set;

a voltage adding circuit configured to add said pulse-width-modulated signal having an amplitude regulated by said amplitude regulator to said voltage having a bottom level regulated by said bottom-level regulator and to output a composite voltage; and a voltage smoothing circuit configured to smooth said composite voltage output by said voltage adding circuit.

7. The converter of claim 6, wherein the signal generator is configured to perform said pulse width modulation based on inputs of a reference clock signal and the lower nl bits of said n-bit digital data set.

8. The converter of claim 7, wherein the signal generator comprises:

a counter configured to count the reference clock signal and output a counting value; and a magnitude comparator configured to receive the counting value, to compare the counting value to the lower nl bits, and to output, upon a value of the lower nl bits being greater than the counting value, the pulse-width modulated signal.

9. The converter of claim 6, wherein said plurality of first pulses comprises:

a first pulse width generated in response to a value of the lower nl bits of said n-bit digital data set.

10. A digital-to-analog converter for converting an n-bit digital data set including upper nh bits and lower nl bits to an analog voltage, comprising:

a signal generator configured to perform a pulse width modulation, to generate a first pulse-width-modulated signal having a plurality of first pulses, and to generate a pulse-width-modulated (pwm) cycle signal indicating a cycle of said pulse width modulation;

a low-weighted value manager configured to receive said first pulse-width-modulated signal, said pwm cycle signal, and the lower nl bits of said n-bit digital data set, and to generate multi-bit pulse-width-modulated signals;

a level regulator configured to receive said multi-bit pulse-width-modulated signals and to output an analog voltage with an upper level regulated in response to a value of said multi-bit pulse-width-modulated signals; and a voltage smoothing circuit configured to smooth said analog voltage output by said level regulator.

11. The converter of claim 10, wherein the signal generator is configured to perform said pulse width modulation based on inputs of a reference clock signal and the upper nh bits of said n-bit digital data set.

12. The converter of claim 11, wherein the signal generator comprises:

a counter configured to count the reference clock signal and output a counting value; and a magnitude comparator configured to receive the counting value, to compare the counting value to the upper nh bits, and to output upon a value of the upper nh bits being greater than the counting value the first pulse-width modulated signal.

13. The converter of claim 10, wherein said first pulse-width-modulated signal comprises:

a plurality of first pulses having a first pulse width generated in response to a value of the upper nh bits of said n-bit digital data set.

14. The converter of claim 10, wherein said multi-bit pulse-width-modulated signals includes said pulse-width-modulated signal as a least significant bit and the lower nl bits of said n-bit digital data.

15. A digital-to-analog converter for converting an n-bit digital data set including upper nh bits, middle nm bits, and lower nl bits to an analog voltage, comprising:

a signal generator configured to perform a pulse width modulation, to generate a first pulse-width-modulated signal having a plurality of first pulses, and to generate a pulse-width-modulated (pwm) cycle signal indicating a cycle of said pulse width modulation;

a low-weighted value manager configured to receive said first pulse-width-modulated signal, said pwm cycle signal, and the lower nl bits of said n-bit digital data set, and to divide a pulse width of said first pulse-width-modulated signal into a plurality of fraction pulse widths in response to a value of the lower nl bits of said n-bit digital data set, to add said plurality of fraction pulse widths to respective of said plurality of the first pulses, and to generate a second pulse-width-modulated signal;

an amplitude regulator configured to regulate an amplitude of said second pulse-width-modulated signal generated by said signal generator;

a bottom-level regulator configured to receive the upper nh bits of said n-bit digital data set and to regulate a bottom level of a voltage in accordance with a value of said upper nh bits of said n-bits digital data set;

a voltage adding circuit configured to add said second pulse-width-modulated signal having an amplitude regulated by said amplitude regulator to said voltage having a bottom level regulated by said bottom-level regulator and to output a composite voltage; and a voltage smoothing circuit configured to smooth said composite voltage output by said voltage adding circuit.

16. The converter of claim 15, wherein the signal generator is configured to perform said pulse width modulation based on inputs of a reference clock signal and the middle nm bits of said n-bit digital data set.

17. The converter of claim 16, wherein the signal generator comprises:

a counter configured to count the reference clock signal and output a counting value; and a magnitude comparator configured to receive the counting value, to compare the counting value to the middle nm bits, and to output, upon a value of the middle nm bits being greater than the counting value, the first pulse-width-modulated signal.

18. The converter of claim 15, wherein said plurality of first pulses comprises:

a first pulse width generated in response to a value of the middle nm bits of said n-bit digital data set.

19. The converter of claim 15, wherein second pulse-width-modulated signal comprises:

a plurality of second pulses including said first pulse width and one of said plurality of fraction pulse widths.

20. A digital-to-analog converter for converting an n-bit digital data set including upper nh bits, middle nm bits, and lower nl bits to an analog voltage, comprising:

a signal generator configured to perform a pulse width modulation, to generate a first pulse-width-modulated signal having a plurality of first pulses, and to generate a pulse-width-modulation (pwm) cycle signal indicating a cycle of said pulse width modulation;

a first low-weighted value manager configured to receive said first pulse-width-modulated signal, said pwm cycle signal, and the middle nm bits of said n-bit digital data set, and to divide a pulse width of the first pulse-width-modulated signal into a plurality of fraction pulse widths in response to a value of the middle nm bits of said n-bit digital data, to add said plurality of fraction pulse widths to respective of said plurality of the first pulses, and to generate a second pulse-width-modulated signal having a plurality of second pulses including said first pulse width and one of said plurality of fraction pulse widths;

a second low-weighted value manager configured to receive said second pulse-width-modulated signal, said pwm cycle signal, and the lower nl bits of said n-bit digital data set, and to generate multi-bit pulse-width-modulated signals including said second pulse-width-modulated signal as a least significant bit and the lower nl bits of said n-bit digital data;

a level regulator configured to receive said multi-bit pulse-width-modulated signals and to output an analog voltage with an upper level regulated in response to a value of said multi-bit pulse-width modulated signals; and a voltage smoothing circuit configured to smooth said analog voltage output by said level regulator.

21. The converter of claim 20, wherein the signal generator is configured to perform said pulse width modulation based on inputs of a reference clock signal and the upper nh bits of said n-bit digital data set.

22. The converter of claim 21, wherein the signal generator comprises:

a counter configured to count the reference clock signal and output a counting value; and a magnitude comparator configured to receive the counting value, to compare the counting value to the upper nh bits, and to output, upon a value of the upper nh bits being greater than the counting value, the first pulse-width-modulated signal.

23. The converter of claim 20, wherein said plurality of first pulses comprises:
a first pulse width generated in response to a value of the upper nh bits of said n-bit digital data set.

24. A digital-to-analog converter for converting an n-bit digital data set including upper nh bits and lower nl bits to an analog voltage, comprising:
signal generating means for performing a pulse width modulation, for generating a first pulse-width-modulated signal having a plurality of first pulses, and for generating a pulse-width-modulation (pwm) cycle signal indicating a cycle of said pulse width modulation;
low-weighted value managing means for receiving said first pulse-width-modulated signal, said pwm cycle signal, and the lower nl bits of said n-bit digital data set, and for dividing a pulse width of the first pulse-width-modulated signal into a plurality of fraction pulse widths in response to a value of the lower nl bits of said n-bit digital data set, adding said plurality of fraction pulse widths to respective of said plurality of the first pulses, and generating a second pulse-width-modulated signal having a plurality of second pulses including said first pulse width and one of said plurality of fraction pulse widths; and
voltage smoothing means for smoothing said second pulse-width-modulated signal output by said low-weighted value managing means.

25. The converter of claim 24, wherein said signal generating means is configured to perform the pulse width modulation based on inputs of a reference clock signal and the upper nh bits of said n-bit digital data set.

26. The converter of claim 25, wherein said signal generating means is configured to generate the plurality of first pulses with a first pulse width associated with a value of the upper nh bits.

27. A digital-to-analog converter for converting an n-bit digital data set including upper nh bits and lower nl bits to an analog voltage, comprising:
signal generating means for performing a pulse width modulation and for generating a pulse-width-modulated signal having a plurality of first pulses;
amplitude regulating means for regulating an amplitude of said pulse-width-modulated signal generated by said signal generating means;
bottom-level regulating means for receiving the upper nh bits of said n-bit digital data set and regulating a bottom level of a voltage in accordance with a value of said upper nh bits of said n-bits digital data set;
voltage adding means for adding said pulse-width-modulated signal having an amplitude regulated by said amplitude regulating means to said voltage having a bottom level regulated by said bottom-level regulating means and outputting a composite voltage; and
voltage smoothing means for smoothing said composite voltage output by said voltage adding means.

28. The converter of claim 27, wherein said signal generating means is configured to perform the pulse width modulation based on inputs of a reference clock signal and the lower nl bits of said n-bit digital data set.

29. The converter of claim 27, wherein said signal generating means is configured to generate the plurality of first pulses with a first pulse width associated with a value of the lower nl bits.

30. A digital-to-analog converter for converting an n-bit digital data set including upper nh bits and lower nl bits to an analog voltage, comprising:
signal generating means for performing a pulse width modulation, for generating a first pulse-width-modulated signal having a plurality of first pulses, and for generating a pulse-width-modulated (pwm) cycle signal indicating a cycle of said pulse width modulation;
low-weighted value managing means for receiving said first pulse-width-modulated signal, said pwm cycle signal, and the lower nl bits of said n-bit digital data set, and for generating multi-bit pulse-width-modulated signals including said first pulse-width-modulated signal as a least significant bit and the lower nl bits of said n-bit digital data set;
level regulating means for receiving said multi-bit pulse-width-modulated signals and outputting an analog voltage with an upper level regulated in response to a value of said multi-bit pulse-width-modulated signals; and
voltage smoothing means for smoothing said analog voltage output by said level regulator.

31. The converter of claim 30, wherein said signal generating means is configured to perform the pulse width modulation based on inputs of a reference clock signal and the upper nh bits of said n-bit digital data set.

32. The converter of claim 30, wherein said signal generating means is configured to generate the plurality of first pulses with a first pulse width associated with a value of the upper nh bits.

33. A digital-to-analog converter for converting an n-bit digital data set including upper nh bits, middle nm bits, and lower nl bits to an analog voltage, comprising:
signal generating means for performing a pulse width modulation, for generating a first pulse-width-modulated signal having a plurality of first pulses, and for generating a pulse-width-modulated (pwm) cycle signal indicating a cycle of said pulse width modulation;
low-weighted value managing means for receiving said first pulse-width-modulated signal, said pwm cycle signal, and the lower nl bits of said n-bit digital data set, and for dividing a pulse width of said first pulse-width-modulated signal into a plurality of fraction pulse widths in response to a value of the lower nl bits of said n-bit digital data set, adding said plurality of fraction pulse widths to respective of said plurality of the first pulses, and generating a second pulse-width-modulated signal having a plurality of second pulses including said first pulse width and one of said plurality of fraction pulse widths;
amplitude regulating means for regulating an amplitude of said second pulse-width-modulated signal generated by said signal generating means;
bottom-level regulating means for receiving the upper nh bits of said n-bit digital data and regulating a bottom level of a voltage in accordance with a value of said upper nh bits of said n-bits digital data;
voltage adding means for adding said second pulse-width-modulated signal having an amplitude regulated by said amplitude regulating means to said voltage having a bottom level regulated by said bottom-level regulating means and outputting a composite voltage; and
voltage smoothing means for smoothing said composite voltage output by said voltage adding means.

34. The converter of claim 33, wherein said signal generating means is configured to perform the pulse width modulation based on inputs of a reference clock signal and the middle nm bits of said n-bit digital data set.

35. The converter of claim 33, wherein said signal generating means is configured to generate the plurality of first pulses with a first pulse width associated with a value of the middle mn bits.

36. A digital-to-analog converter for converting an n-bit digital data set including upper nh bits, middle nm bits, and lower nl bits to an analog voltage, comprising:
   signal generating means for performing a pulse width modulation, for generating a first pulse-width-modulated signal having a plurality of first pulses, and for generating a pulse-width-modulated (pwm) cycle signal indicating a cycle of said pulse width modulation;
   first low-weighted value managing means for receiving said first pulse-width-modulated signal, said pwm cycle signal, and the middle nm bits of said n-bit digital data set, and for dividing a pulse width of the first pulse-width-modulated signal into a plurality of fraction pulse widths in response to a value of the middle nm bits of said n-bit digital data set, adding said plurality of fraction pulse widths to respective of said plurality of the first pulses, and generating a second pulse-width-modulated signal having a plurality of second pulses having said first pulse width and one of said plurality of fraction pulse widths;
   second low-weighted value managing means for receiving said second pulse-width-modulated signal, said pwm cycle signal, and the lower nl bits of said n-bit digital data set, and for generating multi-bit pulse-width-modulated signals including said second pulse-width-modulated signal as a least significant bit and the lower nl bits of said n-bit digital data set;
   level regulating means for receiving said multi-bit pulse-width-modulated signals and outputting an analog voltage with an upper level regulated in response to a value of said multi-bit pulse-width-modulated signals; and
   voltage smoothing means for smoothing said analog voltage output by said level regulating means.

37. The converter of claim 36, wherein said signal generating means is configured to perform the pulse width modulation based on inputs of a reference clock signal and the upper nh bits of said n-bit digital data set.

38. The converter of claim 36, wherein said signal generating means is configured to generate the plurality of first pulses with a first pulse width associated with a value of the upper nh bits.

39. A method of digital-to-analog conversion for converting an n-bit digital data set including upper nh bits and lower nl bits to an analog voltage, comprising the steps of:
   performing a pulse width modulation based on inputs of a reference clock signal and the upper nh bits of said n-bit digital data set;
   generating a first pulse-width-modulated signal having a plurality of first pulses including a first pulse width;
   generating a pulse-width-modulated (pwm) cycle signal indicating a cycle of a pulse width modulation performed;
   dividing a pulse width of said first pulse-width-modulated signal into a plurality of fraction pulse widths in response to a value of the lower nl bits of said n-bit digital data set;
   adding said plurality of fraction pulse widths to respective of said plurality of first pulses;
   outputting a second pulse-width-modulated signal having a plurality of second pulses including the first pulse width and one of said plurality of fraction pulse widths; and
   smoothing said second pulse-width-modulated signal output in said adding step.

40. The method of claim 39, wherein the generating a first pulse-width-modulated signal comprises:
   generating the first pulse-width-modulated signal with the first pulse width determined by a value of the upper nh bits of said n-bit digital data set.

41. A method of digital-to-analog conversion for converting an n-bit digital data set including upper nh bits and lower nl bits to an analog voltage, comprising the steps of:
   performing a pulse width modulation based on inputs of a reference clock signal and the lower nl bits of said n-bit digital data set;
   generating a pulse-width-modulated signal having a plurality of first pulses;
   regulating an amplitude of said pulse-width-modulated signal generated in said performing step;
   determining a bottom level of a voltage in accordance with a value of said upper nh bits of said n-bits digital data set;
   adding said pulse-width-modulated signal having an amplitude regulated in said regulating step to said voltage having a bottom level determined in said determining step to output a composite voltage; and
   smoothing said composite voltage output in said adding step.

42. The method of claim 41, wherein the generating a first pulse-width-modulated signal comprises:
   generating the first pulse-width-modulated signal with a first pulse width determined by a value of the lower nh bits of said n-bit digital data set.

43. A method of digital-to-analog conversion for converting an n-bit digital data set including upper nh bits and lower nl bits to an analog voltage, comprising the steps of:
   performing a pulse width modulation based on inputs of a reference clock signal and the upper nh bits of said n-bit digital data set;
   generating a first pulse-width-modulated signal having a plurality of first pulses;
   generating a pulse-width-modulation (pwm) cycle signal indicating a cycle of a pulse width modulation performed;
   generating multi-bit pulse-width-modulated signals including said pulse-width-modulated signal as a least significant bit and the lower nl bits of said n-bit digital data set;
   outputting an analog voltage with an upper level regulated in response to a value of said multi-bit pulse-width-modulated signals; and
   smoothing said analog voltage output in said outputting step.

44. The method of claim 43, wherein the generating a first pulse-width-modulated signal comprises:
   generating the first pulse-width-modulated signal with a first pulse width determined by a value of the upper nh bits of said n-bit digital data set.

45. A method of digital-to-analog conversion for converting an n-bit digital data set including upper nh bits, middle mn bits, and lower nl bits to an analog voltage, comprising the steps of:

performing a pulse width modulation based on inputs of a reference clock signal and the middle run bits of said n-bit digital data set;

generating a first pulse-width-modulated signal having a plurality of first pulses;

generating a pulse-width-modulation (pwm) cycle signal indicating a cycle of a pulse width modulation performed;

dividing a pulse width of the first pulse-width-modulated signal into a plurality of fraction pulse widths in response to a value of the lower nl bits of said n-bit digital data set;

adding said plurality of fraction pulse widths to respective of said plurality of first pulses;

generating a second pulse-width-modulated signal having a plurality of second pulses including said first pulse width and one of said plurality of fraction pulse widths;

regulating an amplitude of said second pulse-width-modulated signal generated in said adding step;

determining a bottom level of a voltage in accordance with a value of said upper nh bits of said n-bits digital data set;

overlaying said second pulse-width-modulated signal having an amplitude regulated in said regulating step to said voltage having a bottom level determined in said determining step to output a composite voltage; and smoothing said composite voltage output in said overlaying step.

46. The method of claim 45, wherein the generating a first pulse-width-modulated signal comprises:

generating the first pulse-width-modulated signal with a first pulse width determined by a value of the middle nm bits of said n-bit digital data set.

47. A method of digital-to-analog conversion for converting an n-bit digital data set including upper nh bits, middle nm bits, and lower nl bits to an analog voltage, comprising the steps of:

performing a pulse width modulation based on inputs of a reference clock signal and the upper nh bits of said n-bit digital data set;

generating a first pulse-width-modulated signal having a plurality of first pulses including a first pulse width;

dividing a pulse width of the first pulse-width-modulated signal into a plurality of fraction pulse widths in response to a value of the middle nm bits of said n-bit digital data set;

adding said plurality of fraction pulse widths to respective of said plurality of first pulses;

generating a second pulse-width-modulated signal having a plurality of second pulses including said first pulse width and one of said plurality of fraction pulse widths;

generating multi-bit pulse-width-modulated signals including said second pulse-width-modulated signal as a least significant bit and the lower nl bits of said n-bit digital data set;

outputting an analog voltage with an upper level regulated in response to a value of said multi-bit pulse-width-modulated signals; and smoothing said analog voltage output in said outputting step.

48. The method of claim 47, wherein the generating a first pulse-width-modulated signal comprises:

generating the first pulse-width-modulated signal with a first pulse width determined by a value the upper nh bits of said n-bit digital data set.

* * * * *